United States Patent [19]
Yoshida et al.

[11] Patent Number: 5,150,119
[45] Date of Patent: Sep. 22, 1992

[54] DATA COMPRESSION METHOD AND APPARATUS

[75] Inventors: Shigeru Yoshida, Ebina; Yoshiyuki Okada, Isehara; Yasuhiko Nakano; Hirotaka Chiba, both of Atsugi, all of Japan

[73] Assignee: Fujitsu Limited, Kawasaki, Japan

[21] Appl. No.: 744,443

[22] Filed: Aug. 13, 1991

[30] Foreign Application Priority Data

Aug. 13, 1990 [JP] Japan .................. 2-213990
Oct. 19, 1990 [JP] Japan .................. 2-281431
Oct. 19, 1990 [JP] Japan .................. 2-281432
Oct. 19, 1990 [JP] Japan .................. 2-281433

[51] Int. Cl.⁵ ............................. H03M 7/00
[52] U.S. Cl. ..................... 341/51; 341/106
[58] Field of Search ............ 341/51, 50, 67, 106, 341/95

[56] References Cited

U.S. PATENT DOCUMENTS

| | | | |
|---|---|---|---|
| 4,558,302 | 12/1985 | Welch ................ | 340/347 |
| 4,597,057 | 6/1986 | Snow ................ | 341/106 X |
| 4,814,746 | 3/1989 | Miller et al. ........ | 341/95 |
| 4,866,445 | 9/1989 | Velero et al. ....... | 341/106 |
| 4,881,075 | 11/1989 | Weng ................ | 341/87 |
| 5,003,307 | 3/1991 | Whiting et al. ..... | 341/51 |
| 5,016,009 | 5/1991 | Whiting et al. ..... | 341/67 |

FOREIGN PATENT DOCUMENTS

0280549 8/1988 European Pat. Off. .
0286719 10/1988 European Pat. Off. .
0313190 4/1989 European Pat. Off. .
89/12363 12/1989 World Int. Prop. O. .

OTHER PUBLICATIONS

S. Manakata, "Ziv-Lempel Data Compression Algorithms", Information Processing, vol. 26, No. 1, 1985, pp. 2–6.
T. C. Bell, "Better OPM/L Text Compression", IEEE Trans. on Commun. vol., COM-34, No. 12, Dec. 1986, pp. 1176–1182.
T. A. Welch, "A Technique for High-Performance Data Compression", Computer, Jun. 1984, pp. 8–19.
"Hard Disk Cook Book", AP-Labo Inc., Shoeisha, Aug. 15, 1987, pp. A-28-A-34.
D. A. Lelewer et al., "Data Compression", ACM Computing Surveys, vol. 21, No. 4, Dec. 1989, pp. 557–591.
T. Bell et al., "Text Compression", Prentice Hall, Englewood Cliffs, pp. 234–243.

Primary Examiner—Sharon D. Logan
Attorney, Agent, or Firm—Staas & Halsey

[57] ABSTRACT

In a data compression method based on an LZW coding procedure, a list which defines a sequence of tracing partial strings registered in a dictionary is modified so that a position of a first registered partial string among the registered partial strings in a tree structure of registered partial strings is interchanged with a position of a second registered partial string among the registered partial strings in a state where the first and second registered partial strings extend from an identical node of the tree structure.

19 Claims, 31 Drawing Sheets

| i | CODE | Ext[i] |
|---|------|--------|
| P1 | a | b |
| P2 | a | h |
| P3 | a | z |
| P4 | P1 | f |
| P5 | P1 | x |
| P6 | P2 | d |
| P7 | P2 | f |
| P8 | P3 | c |

| i | First[i] |
|---|----------|
| a | P1 |
| P1 | P4 |
| P2 | P6 |
| P3 | P8 |
| P4 | 0 |
| P5 | 0 |
| P6 | 0 |
| P7 | 0 |
| P8 | 0 |

| i | Next[i] |
|---|---------|
| a | 0 |
| P1 | P2 |
| P2 | P3 |
| P3 | 0 |
| P4 | P5 |
| P5 | 0 |
| P6 | P7 |
| P7 | 0 |
| P8 | 0 |

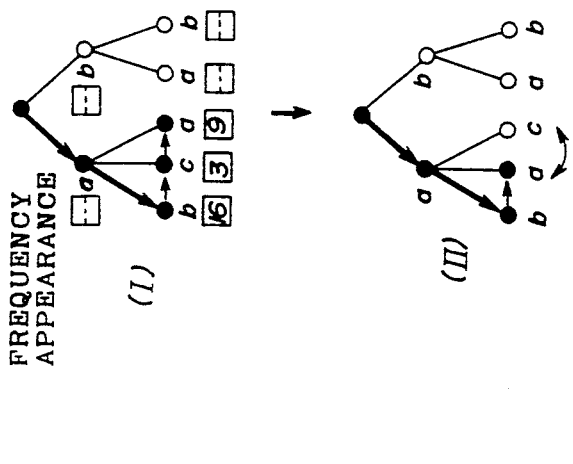
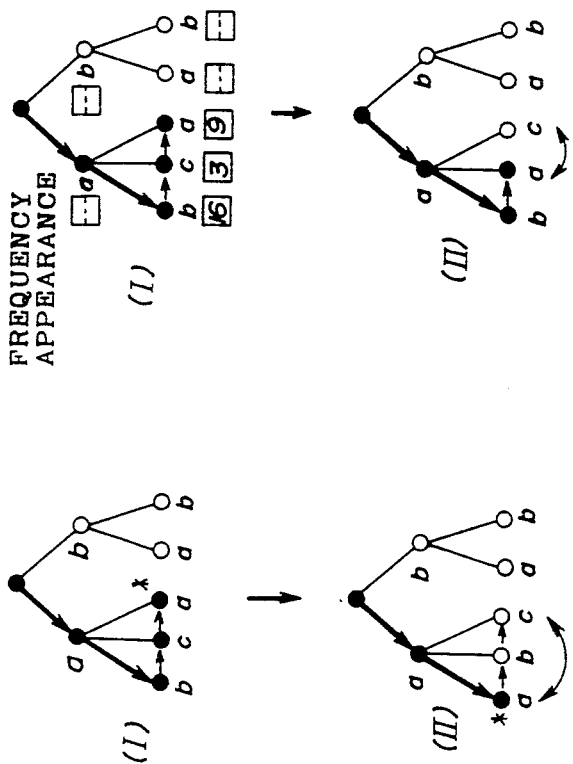
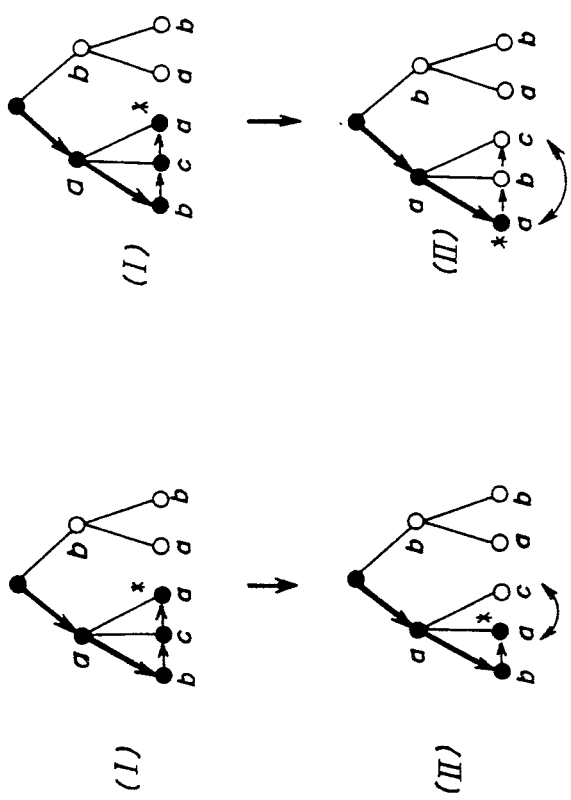
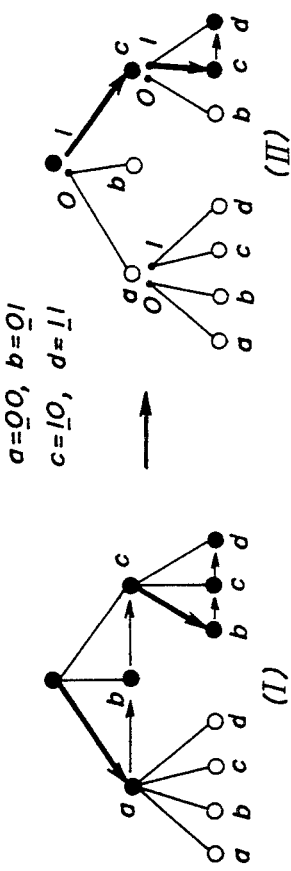

INTERCHANGE

| i | CODE | Ext(i) |
|---|---|---|
| P1 | a | b |
| P2 | a | h |
| P3 | a | g |
| P4 | P1 | f |
| P5 | P1 | x |
| P6 | P2 | d |
| P7 | P2 | f |
| P8 | P3 | c |
| P9 | P3 | g |
| P10 | P3 | w |

| i | First[i] |
|---|---|
| a | P1 |
| P1 | P4 |
| P2 | P6 |
| P3 | P8 |
| P4 | 0 |
| P5 | 0 |
| P6 | 0 |
| P7 | 0 |
| P8 | 0 |
| P9 | 0 |
| P10 | 0 |

| i | Next[i] |
|---|---|
| a | $\bar{0}$ |
| P1 | P2 |
| P2 | P3 |
| P3 | 0 |
| P4 | P5 |
| P5 | 0 |
| P6 | P7 |
| P7 | 0 |
| P8 | P9 |
| P9 | P10 |
| P10 | 0 |

| i | CODE | Ext[i] |
|---|---|---|
| P1 | a | b |
| P2 | a | h |
| P3 | a | z |
| P4 | P1 | f |
| P5 | P | x |
| P6 | P | d |
| P7 | P2 | f |
| P8 | P3 | c |
| P9 | P3 | g |
| P10 | P3 | w |

| i | First(i) |
|---|---|
| a | P1 |
| P1 | P4 |
| P2 | P6 |
| P3 | P8 |
| P4 | 0 |
| P5 | 0 |
| P6 | 0 |
| P7 | 0 |
| P8 | 0 |
| P9 | 0 |
| P10 | 0 |

| i | Next[i] |
|---|---|
| a | 0 |
| P1 | P3 |
| P2 | 0 |
| P3 | P2 |
| P4 | P5 |
| P5 | 0 |
| P6 | P7 |
| P7 | 0 |
| P8 | P9 |
| P9 | P10 |
| P10 | 0 |

INTERCHANGE

| i | CODE | Ext[i] |
|---|---|---|
| P1 | a | b |
| P2 | a | h |
| P3 | a | z |
| P4 | P1 | f |
| P5 | P1 | x |
| P6 | P2 | d |
| P7 | P | f |
| P8 | P3 | c |
| P9 | P3 | g |
| P10 | P3 | w |

10b

| i | First[i] |
|---|---|
| a | P1 |
| P1 | P4 |
| P2 | P6 |
| P3 | P8 |
| P4 | 0 |
| P5 | 0 |
| P6 | 0 |
| P7 | 0 |
| P8 | 0 |
| P9 | 0 |
| P10 | 0 |

100

| i | Next[i] |
|---|---|
| a | 0 |
| P1 | P3 |
| P2 | 0 |
| P3 | P2 |
| P4 | P5 |
| P5 | 0 |
| P6 | P7 |
| P7 | 0 |
| P8 | P10 |
| P9 | 0 |
| P10 | P9 |

101

10a

INTERCHANGE

10b

| $i$ | CODE | Ext$[i]$ |
|---|---|---|
| P1 | a | b |
| P2 | a | h |
| P3 | a | z |
| P4 | P1 | f |
| P5 | P1 | x |
| P6 | P2 | d |
| P7 | P2 | f |
| P8 | P3 | c |

10a

100

| $i$ | First$[i]$ |
|---|---|
| a | P1 |
| P1 | P4 |
| P2 | P6 |
| P3 | P8 |
| P4 | 0 |
| P5 | 0 |
| P6 | 0 |
| P7 | 0 |
| P8 | 0 |

101

| $i$ | Next$[i]$ |
|---|---|
| a | $\bar{0}$ |
| P1 | P2 |
| P2 | P3 |
| P3 | 0 |
| P4 | P5 |
| P5 | 0 |
| P6 | P7 |
| P7 | 0 |
| P8 | 0 |

| i | CODE | Ext [i] |
|---|---|---|
| P1 | a | b |
| P2 | a | h |
| P3 | a | z |
| P4 | P1 | f |
| P5 | P1 | x |
| P6 | P2 | d |
| P7 | P2 | f |
| P8 | P3 | c |

| i | First [i] |
|---|---|
| a | P2 |
| P1 | P4 |
| P2 | P6 |
| P3 | P8 |
| P4 | 0 |
| P5 | 0 |
| P6 | 0 |
| P7 | 0 |
| P8 | 0 |

| i | Next [i] |
|---|---|
| a | 0 |
| P1 | P3 |
| P2 | P1 |
| P3 | 0 |
| P4 | P5 |
| P5 | 0 |
| P6 | P7 |
| P7 | 0 |
| P8 | 0 |

INTERCHANGE

| i | CODE | Ext[i] |
|---|---|---|
| P1 | a | b |
| P2 | a | h |
| P3 | a | z |
| P4 | P1 | f |
| P5 | P1 | x |
| P6 | P2 | d |
| P7 | P2 | f |
| P8 | P3 | c |

| i | First[i] |
|---|---|
| a | P2 |
| P1 | P4 |
| P2 | P6 |
| P3 | P8 |
| P4 | 0 |
| P5 | 0 |
| P6 | 0 |
| P7 | 0 |
| P8 | 0 |

| i | Next[i] |
|---|---|
| a | $\bar{0}$ |
| P1 | P3 |
| P2 | P1 |
| P3 | 0 |
| P4 | P5 |
| P5 | 0 |
| P6 | P7 |
| P7 | 0 |
| P8 | 0 |

10b / 10a / 100 / 101

| i | CODE | Ext[i] |
|---|------|--------|
| P1 | a | b |
| P2 | a | h |
| P3 | a | z |
| P4 | P1 | f |
| P5 | P1 | x |
| P6 | P2 | d |
| P7 | P2 | f |
| P8 | P3 | c |

10b

10a {

| i | First[i] |
|---|----------|
| a | P2 |
| P1 | P4 |
| P2 | P7 |
| P3 | P8 |
| P4 | 0 |
| P5 | 0 |
| P6 | 0 |
| P7 | 0 |
| P8 | 0 |

100

| i | Next[i] |
|---|---------|
| a | 0 |
| P1 | P3 |
| P2 | P1 |
| P3 | 0 |
| P4 | P5 |
| P5 | 0 |
| P6 | 0 |
| P7 | P6 |
| P8 | 0 |

INDEX Ext[i] Cnt[i] Flag[i] First[i] Next[i]

|    |   |   |   |    |    |
|----|---|---|---|----|----|
| P1 | a | r | 2 | 0  | P2 |
| P2 | a | d | 6 | 1  | P3 |
| P3 | a | c | 3 | 0  | P4 |
| P4 | a | a | 5 | 1  | 0  | a: P1 a
╱ │ ╲ ╲
r  d  c  a
P1:P2:P3:P4: BEFORE INTERCHANGE

DATA COMPRESSION METHOD AND APPARATUS

BACKGROUND OF THE INVENTION

1. Field of the Invention present invention generally relates to data compression schemes, and more particularly to a data compression method and apparatus based on the LZW algorithm.

2. Description of the Prior Art

Recently, a variety of data, such as character codes, vector information and image information is processed by a computer. Further, the quantity of data processed by the computer is rapidly increasing. In order to efficiently process a large quantity of data at a high speed, it is necessary to exploit redundant parts of the data. A universal coding capable of compressing a variety of data by a single compression algorithm has been proposed. In this specification, data amounting to one word will be referred to as a "character", and data corresponding to a plurality of consecutive words will be referred to as a "character string".

The Ziv-Lempel coding is known as one of the typical universal encoding procedures (see, S. Munataka, "Ziv-Lempel Data compression Algorithms", Information Processing, Vol. 26, No. 1, 1985, pp. 2–6, the disclosure of which is hereby incorporated by reference). A universal type algorithm and an incremental parsing algorithm have been proposed as suitable algorithms of the Ziv-Lempel encoding. Further, an LZSS code is known as an improvement in the universal type algorithm (see T. C. Bell, "Better OPM/L Text Compression", IEEE Trans. on Commun. Vol., COM-34, No. 12, Dec. 1986, pp. 1176–1182, the disclosure of which is hereby incorporated by reference). Meanwhile, an LZW (Lempel-Ziv-Welch) code is known as an improvement in the incremental parsing algorithm (see T. A. Welch, "A Technique for High=Performance Data Compression", Computer, June 1984, pp. 8–19, the disclosure of which is hereby incorporated by reference). Out of the above-mentioned codes, the LZW code is used for file compression in a storage device because the algorithm thereof is simpler than the other algorithms.

A description will now be given of the LZW coding with reference to FIGS. 1, 2 and 3. More specifically, FIG. 1 is a flowchart of an LZW coding procedure, FIG. 2 is a flowchart of an LZW decoding procedure, and FIG. 3 shows the LZW coding and decoding. In FIG. 3, data (message) consisting of combinations of three characters 'a', 'b' and 'c' is processed for the sake of simplicity.

Referring to FIG. 1, the LZW coding is carried out as follows. At step S1, all partial strings, each consisting of a single character, are registered, as initial values, into a programmable dictionary. After that, the LZW coding starts. A reference number is assigned to each of the partial strings, each consisting of a single character. At step 1, the dictionary is retrieved by the the first input character K, and the reference number corresponding to the first input character K is obtained. The first input character is defined as a prefix string.

At step S2, the second input character K subsequent to the first input character is input, and determined, at step S3, whether or not the first input character K existed. When the result at step S3 is YES, it is determined, at step S4, whether or not a partial string ($\omega K$) obtained by adding the second input character K to the reference number $\omega$ of the first input character has been registered in the dictionary (or has been recognized). When the result obtained at step S4 is NO, at step S6 the reference number $\omega$ of the character K determined at step S1 is output as a code or code ($\omega$) and the partial string ($\omega K$) is registered, together with a new reference number, into the dictionary. Further, at step S6, the partial string obtained at at step S2 is replaced by the reference number $\omega$, and the procedure returns to step S2. Then, the dictionary address, labeled n, for inputting the consecutive characters one by one is incremented by 1. When the result obtained at step S3 is NO, the reference number $\omega$ is output as the code ($\omega$) at step S7. In this way, the above-mentioned procedure is repeatedly carried out until it is recognized that the dictionary does not have any partial string ($\omega K$).

An example of the LZW coding will now be described with reference to (A) and (B) of FIG. 3. Input data shown in (A) of FIG. 3 is read from left to right. The first character 'a' is searched for in a dictionary 10. It will be noted that three partial strings 'a', 'b', and 'c' have been registered before starting coding. Since the first character has been registered in the dictionary 10, its extended string obtained by adding the second input character to the first input character, namely, 'ab', is searched for in the dictionary. At this time, the dictionary 10 does not have any extended strings. Thus, the code ($\omega$), that is, code 1 is output for this string, and reference number 4 is assigned to the partial string 'ab'. In actuality, the reference number 4 is registered in the form of $\omega K$. That is, the partial string 'ab' is described as 1b. Then, the second input character b is used to start the next string. Since its extension 'ba' is not in the dictionary 10, it is put there under reference number 5, the code for 'b' is output, and 'a' starts the next string. The above-mentioned process continues straightforwardly.

Referring to FIG. 2, the LZW decoding procedure, which is the reverse procedure of the LZW coding procedure, is carried out as follows. At step S11, all partial strings, each consisting of one character, are registered, together with respective reference numbers, in a dictionary on the decoding side. At step S1, the first code (reference number) is read, and a variable CODE indicating the current code is replaced by a variable OLD code. Since the first code always corresponds to the reference number of one of the characters already registered in the dictionary, the character Code (K) corresponding to the variable CODE is searched for, and the character K is output. The output character (K) is written into a variable FINchar used for an exception procedure at step S18, which will be described in detail later.

At step S12, the next (second) code is read, and written, as INcode, into the variable CODE. At step S13, it is determined whether or not any code input existed. When the result at step S13 is NO, the procedure ends. On the other hand, when the result at step S13 is YES, it is determined, at step S14, whether or not the code CODE defined at step S12 has been defined (registered) in the dictionary. When the result obtained at step S14 is NO, the procedure proceeds to step S15, at which step it is determined whether or not the partial string ($\omega K$) corresponding to the code CODE has been registered in the dictionary. When the result at step S15 is YES, the partial string K is temporarily stacked, and the reference number code ($\omega$) is written into the variable CODE. Then, the procedure returns to step S15. Steps S15 and S16 are repeatedly carried out until the reference number ω becomes equal identical to a single character. When the result at step S15 becomes YES, the characters stacked at step S16 are output by an LIFO (Last In Fast Out) process. At the same time, a new reference number is assigned to a partial string (ωK) consisting of the previously used code ω and the first character of the partial string decoded this time.

An example of the LZW decoding procedure will be described with reference to (C) and (D) of FIG. 3. The first input code is 1, as shown in (D) of FIG. 3, and the reference numbers of the characters 'a', 'b' and 'c' have been respectively registered as 1, 2 and 3 in the dictionary, as shown in (C) of FIG. 9. Thus, the first input code 1 is replaced by the partial string 'a' having reference number 1. The next (second) input code 2 is replaced by the character 'b' in the same way. At this time, the combination of the previously processed code 1 and the presently processed code 2, that is, '1b' is assigned reference number 4, which is registered in the dictionary 10 on the decoder side.

The third input code 4 is replaced by '1b' and then 'ab' by retrieving the dictionary 10. At the same time, a partial string '2a' (='ba') corresponding to the combination of the previously processed code 2 and the first character 'a' of the partial string processed this time is assigned reference number 5, which is registered in the dictionary 10. The above-mentioned process continues straightforwardly.

The LZW decoding procedure has an exception process. This exception process is needed for decoding the sixth input code 8. The code 8 is not registered in the dictionary 10 during the above-mentioned procedure, so that it cannot be decoded. In this case, partial string '5b' is obtained by adding the first character of the partial string 'ba' previously decoded to the code 5 previously processed, and is further replaced by '2ab' and then 'bab'. Then, the partial string '5b' obtained by adding the first character of the partial string 'ba' to the code 5 previously processed is registered, together with reference number 8, in the dictionary 10.

The above-mentioned exception process is executed by steps S14 and S18 shown in FIG. 2. Finally, at step S17, the partial string 'bab' is output and the combination (ω, K) is registered, together with the corresponding reference number, in the dictionary 10.

The LZW coding and decoding procedures respectively shown in FIGS. 1 and 2 are carried out while the same dictionary is being created However, it takes a long time to search for one partial string by the LZW coding and decoding procedures In the worst case, it is necessary to retrieve the entire dictionary 10. In order to eliminate this problem and speed up the coding and decoding procedures, an open hashing (chaining) method for dictionary retrieval has been proposed (see "Information Processing Handbook", The Institute of Information Processing, Ohm Corporation).

FIG. 4 shows an outline of the open hashing method The open hashing method defines a hash function for obtaining the address indicating a storage area in which an element x (character string) of a set S made up of character strings on the basis of the element x. The element x is stored in the storage area indicated by the address obtained by the hash function. When storage areas (a hash table) are assigned addresses 0 to m−1, the following hash function, labeled h, is defined as follows:

$$h : S \rightarrow [0, 1, \ldots, m-1]$$

The address of the element (character string) x in the set S is determined by a hash address h(x). Normally, the hashing procedure is employed in a case where the size of the set S is much greater than m. Even if any hash function h is selected, there is a possibility that h(x1)=h(x2) where x1 and x2 are different character strings in the set S. This is called collision. The open hashing method can cope with such collision According to the open hashing method, as shown in FIG. 4, a list is provided for each hash address i, and the character strings x which satisfy h(x)=i are put in the same list from the head (beginning) of the list. The list having the same hash address is called a bucket.

FIGS. 5, 6 and 7 show a conventional LZW coding procedure based on the open hashing method. More specifically, FIG. 5 shows a tree structure for dictionary retrieval, FIG. 6 shows the state of a partial string table 10b and the state of an open hash table 10b, and FIG. 7 shows a conventional LZW coding procedure using the open hashing method (see "Hard Disk Cook Book", AP-Labo Inc., Shoeisha, Aug. 15, 1987, pp. A-28-A-34).

Referring to FIG. 6, the partial string table 10b stores a character code for each index i and a character (extension character) Ext[i]. The open hash table 10a consists of two table parts 100 and 101. The table part 100 defines a sequence First, and the table part 101 defines a sequence Next. The table part 100 corresponds to the index dictionary shown in FIG. 4, and the table part 101 corresponds to the linked lists (buckets). The component of the sequence First, First[i], indicates the index (address) showing the first partial string positioned at the beginning of the list specified by the index (reference number) i, and the component of the sequence Next, Next[i], indicates the index (pointer) showing an element which corresponds to a "brother" of the element of the reference number i. The component of the sequence Ext, Ext[i] indicates an extension character added to the ith element of the partial string table.

The open hashing method is intended to calculating, at a high speed, the reference number of a partial string obtained by adding the extension character to the reference number (hash address) i of the previously encountered partial string. The hash table 10a is retrieved by the hash address of the partial string obtained by adding the extension character to the reference number (hash address) i. The list includes information about the extension character which is added to the reference number i. The extension character is compared with the input character K. When both the characters are different from each other, the next extension character indicated by the pointer (address) Next[i] of the extension character which is determined not to be identical to the input character is compared with the input character K. In this way, it is possible to retrieve all one-character-added partial strings which have been encountered. When all one-character-added partial strings have been checked and they do not coincide with the K added partial string, an linked address 0 is finally obtained, so that it is recognized that the identical partial string is not registered.

Referring to FIG. 5, a description will now be given of a procedure for searching for 'ahf' when partial strings 'ab', 'ah', 'az', 'abf', 'ahd', 'ahf' and 'azc' have been registered in the dictionary. The initial state of the partial string table 10b and the open hashing table 10a are as shown in FIG. 6. The first character 'a' has been registered in the dictionary. In order to search for the second character 'h', the component First[i=a] of the sequence First is referred to by the hash address 'a', so that P1 is obtained. Thereby, the partial string 'ab' starting from 'a' indicated by the index P1 is found. However, the second character of the partial string 'ab' is not the same as that of the partial string 'ahf'. Then, the sequence Next is retrieved by the hash address P1, so that P2 is obtained. The partial string indicated by the index P2 is 'ah', the second character of which is the same as that of the partial string 'ahf'. Then, the third character 'f' of the partial string 'ahf' is searched for. The sequence First is retrieved by the hash address P2, so that P6 is obtained. The third character of the partial string indicated by P6 is 'd', which is not the same as that of the partial string 'ahf'. Thus, the sequence Next is retrieved by the hash address P6, so that P7 is obtained. The third character of the partial string indicated by P6 is 'f', which is the same as that of the partial string 'ahf'. The route for retrieving the partial string 'ahf' is composed of paths ①, ②, ③ and ④ in this order, as shown in FIG. 5.

FIG. 7 shows the above-mentioned LZW coding procedure. At step S20, the dictionary is initialized so that each one-character contained in the input character string is registered. Then, the reference number assigned to the partial string which is next to be registered is written into the variable n. For example, the reference numbers 1, 2 and 3 respectively assigned to characters 'a', 'b' and 'c' are registered in the dictionary, and reference number 4 is written into the variable n. A maximum number of partial strings Nmax is determined, and the aforementioned sequences First, Next and Ext, each having the maximum number of partial strings are defined. Initially, zero is written into the sequences First, Next and Ext as the initial values. The ith component First[i] of the sequence First shows the number indicating a component of the sequence Ext located at the head of the list corresponding to the node indicated by the reference number i. The ith component Ext[i] of the sequence Ext shows extension character K of an element indicated by the reference number i. Further, the ith component Next[i] has a pointer indicating an element corresponding to a "brother" of the element indicated by the reference number i.

The first character (prefix string) K is read, and the reference number thereof is written into the variable i. Then, the coding procedure starts. At step S21, the next character subsequent to the first character is read as the extension character K. At step S22, it is determined whether or not the first input character K existed. When the result at step S22 is YES, a dictionary retrieval procedure 50 consisting of steps S23-S27 is executed.

At step S23, the variable i is saved in another variable ω, and an initial value "0" is written into the variable j. At step S24, the number of the component of the sequence Next indicated by the value of the component First[i] corresponding to the variable i is written into the variable i. At step S25, when it is determined that the value of the variable i is not "0", the retrieval procedure for the corresponding list is started. The corresponding list contains one or more candidate elements. At step S26, the component Ext[i] is compared with the extension character K. When the result at step S26 is NO, at step S27 the value of the variable i is save in the variable j, and the component Next[i] serving as a pointer which shows the next candidate element is written into the variable i. By repeatedly executing steps S25-S27, the corresponding list is retrieved.

When it is determined, at step S26, that Ext[i]=K, it is determined that the partial string identical to the input character string has been registered in the dictionary. In this case, the procedure returns to step S21, and the coding procedure for a character string with the next character input at step S21 added is carried out.

On the other hand, when the component First[i] or the component Next[i] corresponding to the variable i is "0", the result at step S25 is YES. In this case, it is recognized that the dictionary does not have any candidate element which is to be linked to the partial string indicated by the reference number i. In this case, a dictionary registration procedure 60 consisting of steps S29-S32 is executed.

The reference number corresponding to the partial string retrieved at step S23 is saved in the variable ω each time the partial string is retrieved. Thus, the reference number saved in the variable ω shows the already encountered partial string which makes a longest match with the input character string. At step S28, a code corresponding to the reference number ω is output, and the new partial string is registered in the dictionary by the steps S29-S32.

At step step S29, the value of the variable n is written into the variable i, and then incremented by 1. Further, the component Ext[i] corresponding to the variable i is set to the extension character K. At step S30, it is determined whether or not the value of the variable j is "0". When the result at step S30 is YES, at step S31 the value of the variable i is written into the component First[ω] and the list corresponding to the reference number ω is defined. On the other hand, when the result at step S30 is NO, the value of the variable i is written into the component Next[ω], the new "brother" is added to the list being considered. At step S33, the reference number corresponding to the extension character K is written into the variable i, and the procedure returns to step S21. When there is no character which is to be input, a code corresponding to the variable ω obtained at this time is output at step S34, and the procedure ends.

However, the above-mentioned conventional coding method has the following disadvantages. First, it is not designed to modify the open hash table 10a shown in FIG. 6. That is, it is not designed to change the position of each partial string in the tree structure. Thus, if a partial string which is frequently retrieved is registered at a deep position available via a long route from the root of the tree structure, it takes a long time to access such a partial string because this route must be traced each time it is searched for, so that the retrieval procedure is not executed efficiently. When the coding rate is equal to about 10KB/s, it is impossible to code the input character string in real time so that the coding procedure matches a transfer speed (a few of 100KB/s to 1MB/s) at which coded data is transferred to a storage device, such as a magnetic disk drive or magnetic disk tape device. Second, since each partial string is registered in the tree structure in the order of appearance, if a partial string which is frequently retrieved is registered at a position away from the root of the tree structure, the same problems as described above will occur. Third, the conventional coding procedure is not designed to change the route for retrieval. Thus, the same problems as described above take place.

SUMMARY OF THE INVENTION

It is a general object of the present invention to provide an improved data compression method and apparatus in which the above-mentioned disadvantages are eliminated.

A more specific object of the present invention is to provide a data compression method and apparatus capable of efficiently executing coding at a higher speed.

The above-mentioned objects of the present invention are achieved a data compression method comprising the steps of:

(a) determining whether or not an input partial string which corresponds to a part of an input data string coincides with any of registered partial strings which have been registered in a dictionary in accordance with a retrieval order indicated by data stored in a list, the registered partial strings being arranged in a tree structure in an order in which the registered partial strings appear and being assigned reference numbers, the list being provided for each node of the tree structure;

(b) coding the input partial string which makes a longest match with one of the registered partial strings by a reference number which has been registered in the dictionary and which has been assigned to the one of the registered partial strings;

(c) assigning a reference number to a partial string obtained by adding extension data to the input partial string and registering the reference number in the dictionary; and (d) modifying the list so that a position of a first registered partial string among the registered partial strings in the tree structure is interchanged with a position of a second registered partial string among the registered partial strings, the first and second registered partial strings extending from an identical node of the tree structure.

The above-mentioned objects of the present invention are also achieved by a data compression method comprising the steps of:

(a) determining which one of a plurality of groups is related to an input partial string which corresponds to a part of an input data string on the basis of information about the input partial string, each of the groups storing at least one registered partial string registered in a dictionary;

(b) determining whether or not the input partial string coincides with any of registered partial strings in accordance with a retrieval order indicated by data stored in a list, the registered partial strings being arranged in a tree structure in an order in which the registered partial strings appear and being assigned reference numbers, registered strings extending from an identical node of the tree structure being grouped into the plurality of groups, the list being provided for each of the groups;

(c) coding the input partial string which makes a longest match with one of the registered partial strings by a reference number which has been registered in the dictionary and which has been assigned to the one of the registered partial strings;

(d) assigning a reference number to a partial string obtained by adding extension data to the input partial string and registering the reference number in the dictionary.

The aforementioned objects of the present invention are also achieved by a data compression apparatus comprising:

first means for determining whether or not an input partial string which corresponds to a part of an input character string coincides with any of registered partial strings which have been registered in a dictionary in accordance with a retrieval order indicated by data stored in a list, the registered partial strings being arranged in a tree structure in an order in which the registered partial strings appear and being assigned reference numbers, the list being provided for each node of the tree structure;

second means, coupled to the first means, for coding the input partial string which makes a longest match with one of the registered partial strings by a reference number which has been registered in the dictionary and which has been assigned to the one of the registered partial strings;

third means, coupled to the first and second means, for assigning a reference number to a partial string obtained by adding extension data to the input partial string and registering the reference number in the dictionary; and fourth means, coupled to the first means, for modifying the list so that a position of a first registered partial string among the registered partial strings in the tree structure is interchanged with a position of a second registered partial string among the registered partial strings, the first and second registered partial strings extending from an identical node of the tree structure.

The aforementioned objects of the present invention are also achieved by a data compression apparatus comprising:

first means for determining which one of a plurality of groups is related to an input partial string which corresponds to a part of an input data string on the basis of information about the input partial string, each of the groups storing at least one registered partial string registered in a dictionary;

second means, coupled to the first means, for determining whether or not the input partial string coincides with any of registered partial strings in accordance with a retrieval order indicated by data stored in a list, the registered partial strings being arranged in a tree structure in an order in which the registered partial strings appear and being assigned reference numbers, registered strings extending from an identical node of the tree structure being grouped into the plurality of groups, the list being provided for each of the groups;

third means, coupled to the first and second means, for coding the input partial string which makes a longest match with one of the registered partial strings by a reference number which has been registered in the dictionary and which has been assigned to the one of the registered partial strings;

fourth means, coupled to the second and third means, for assigning a reference number to a partial string obtained by adding extension data to the input partial string and registering the reference number in the dictionary.

BRIEF DESCRIPTION OF THE DRAWINGS

Other objects, features and advantages of the present invention will become more apparent from the following detailed description when read in conjunction with the accompanying drawings, in which:

FIG. 3 is a diagram of the conventional LZW coding and decoding procedures;

FIG. 6 is a diagram showing a partial string table and an open hashing table;

FIG. 8A is a diagram showing an outline of a first preferred embodiment of the present invention;

FIG. 8B is a diagram showing an outline of a second preferred embodiment of the present invention;

FIG. 8C is a diagram showing an outline of a third preferred embodiment of the present invention;

FIG. 8D is a diagram showing an outline of a fourth preferred embodiment of the present invention;

FIGS.25A and 25B are respectively diagrams showing how a partial string table and an open hash table are modified;

DESCRIPTION OF THE PREFERRED EMBODIMENTS

A description will now be given of the outline of the first preferred embodiment of the present invention with reference to FIG. 8A. FIG. 8A-(I) shows a conventional tree structure in which the partial strings are linked together in the order of appearance thereof. The tree structure shown in FIG. 8A-(I) has a first level consisting of characters 'a' and 'b', and a second level having characters 'b', 'c' and 'a' linked to the character 'a' at the first level and characters 'a' and 'b' linked to the character 'b' at the first level. When the character 'a' indicated by symbol * is searched for in an order of 'a', 'b', 'c' and 'a', as shown in FIG. 8A-(I). Meanwhile, according to the first preferred embodiment of the present invention, the retrieval order can be changed, as shown in FIG. 8A-(II). The registration position of the character 'a' indicated by * in FIG. 8A-(I) is interchanged with that of the character 'c' immediately prior to the character 'a' indicated by *, as shown in FIG. 8A-(II). It will be noted that three characters 'b', 'c' and 'a' extending from the node 'a' is contained in the same list. Thereby, the character 'a' indicated by * is obtained via a route passing through characters 'a', 'b' and 'a' in this order. The above-mentioned interchanging procedure is carried out when the character 'a' indicated by * has a high frequency of appearance.

Figure 9A:
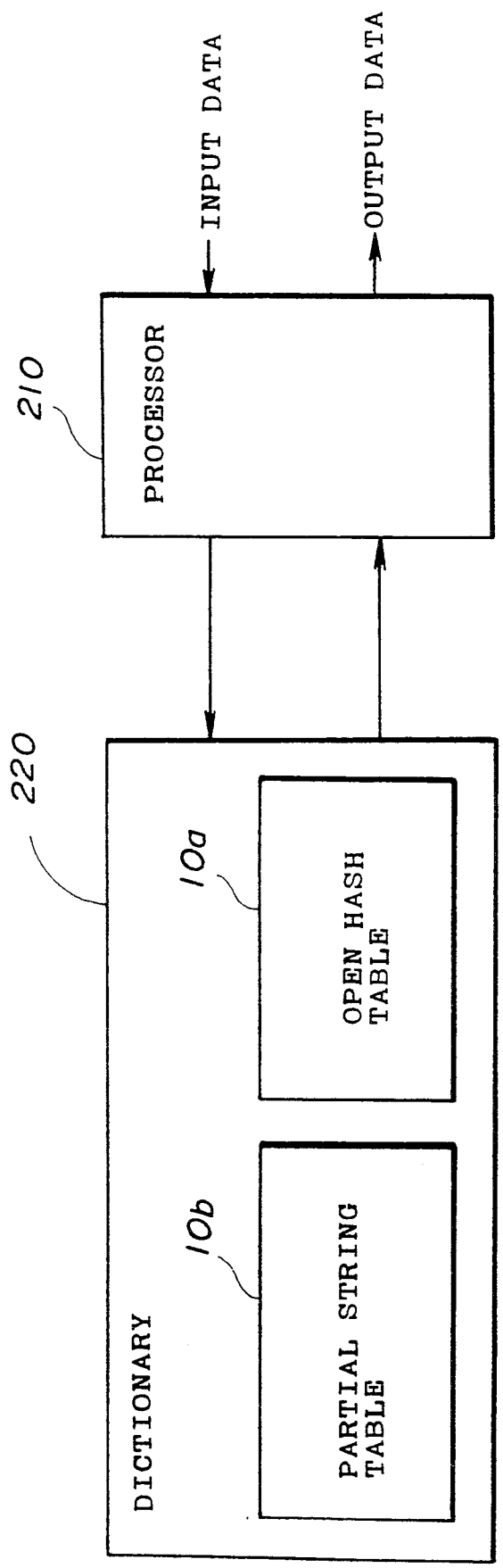
FIGS. 9A and 9B are respectively diagrams showing a first preferred embodiment of the present invention.

FIG. 9A shows a system structure of the first preferred embodiment of the present invention. The structure in FIG. 9A is composed of a processor 210 and a dictionary (memory) 220. The dictionary 220 has the open hash table 10a and the partial string table 10b. The processor 200 operates in accordance with a procedure, which will be described in detail later.

Figure 9B:
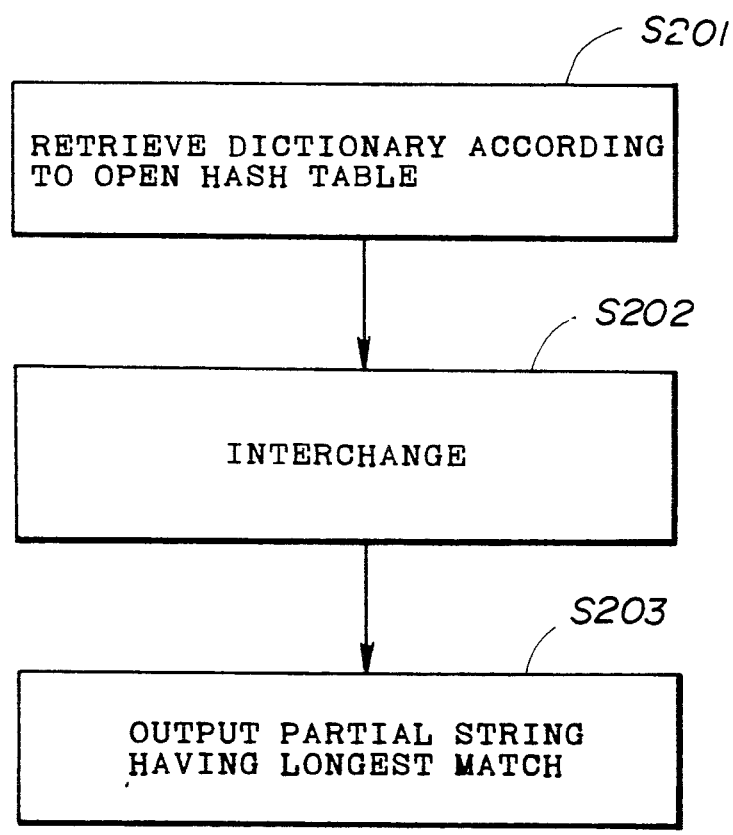

FIG. 9B is a flowchart of a coding procedure according to the first preferred embodiment of the present invention. At step S201, the dictionary 220 is retrieved by using the open hash table 10a. At step S202, the open hash table 10a is modified so that the position of the partial string being searched for is interchanged with the position of a partial string immediately prior hereto, these partial strings have an identical hash address). At step S203, the retrieved partial string having a longest match with the input character string is output.

Figure 1:
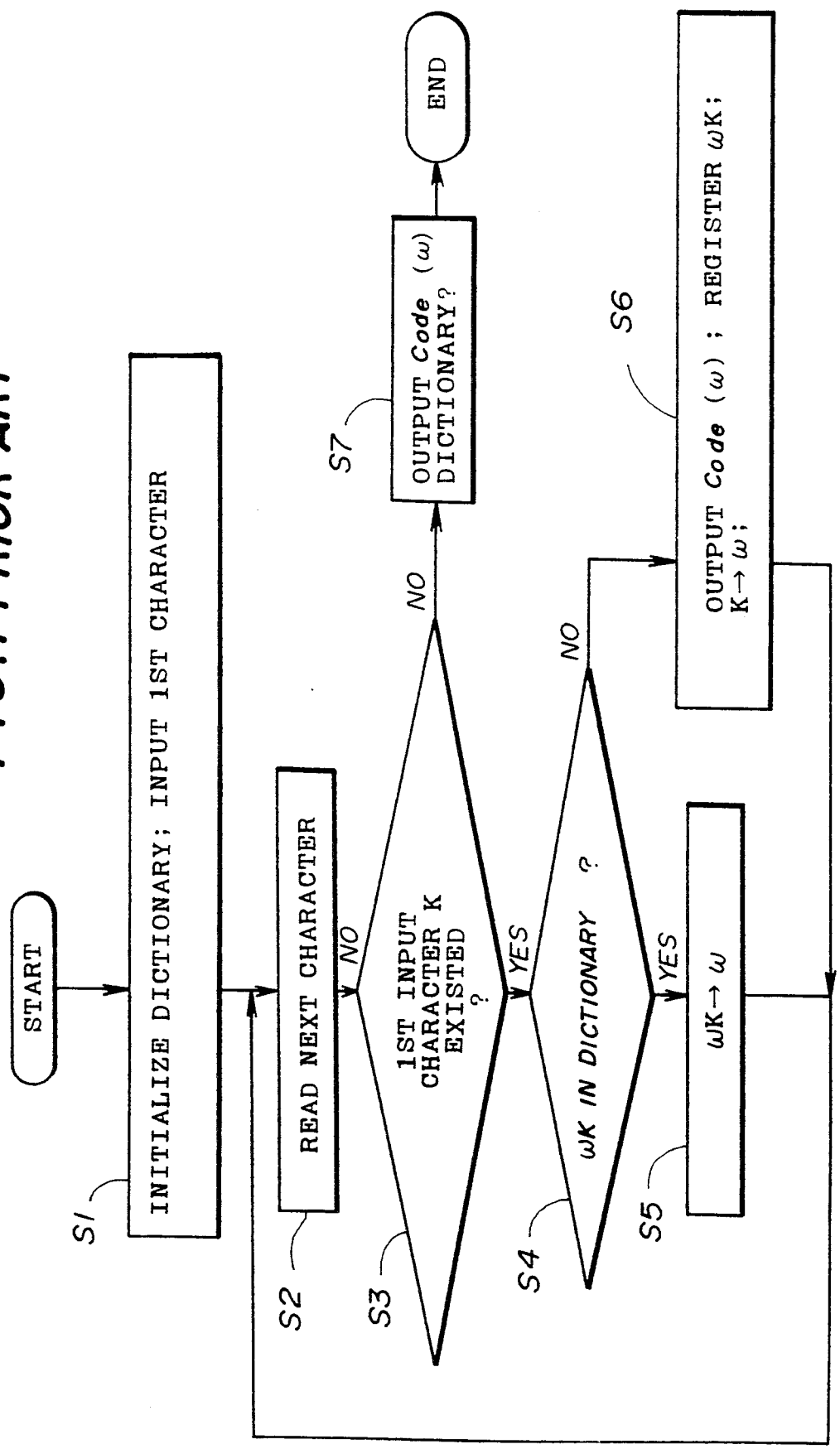
FIG. 1 is a flowchart of a conventional LZW coding procedure.
Figure 2:
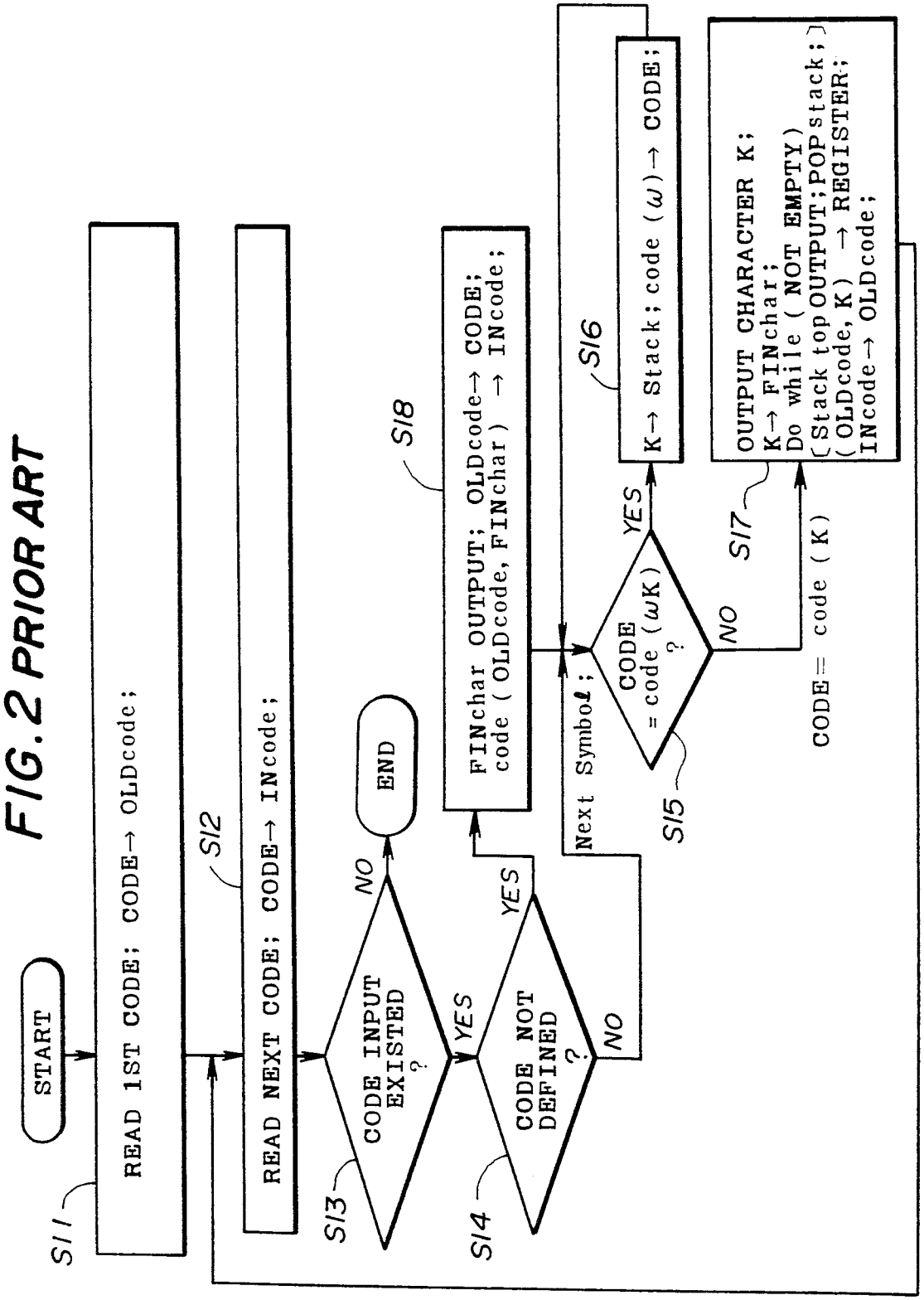
FIG. 2 is a flowchart of a conventional LZW decoding procedure.
Figure 4:
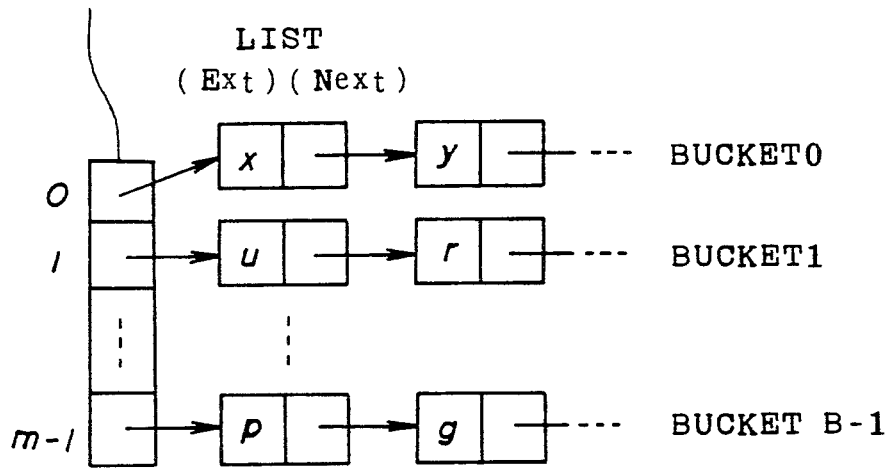
FIG. 4 is a diagram illustrating an open hashing method.
Figure 5:
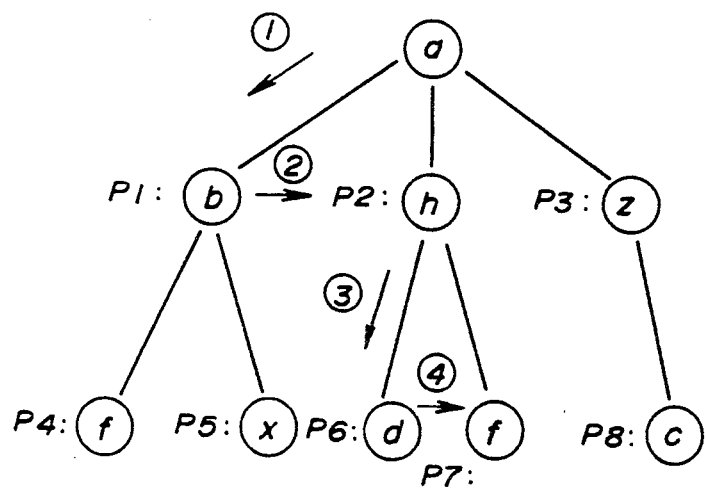
FIG. 5 is a diagram of a tree structure of a dictionary.
Figure 7:
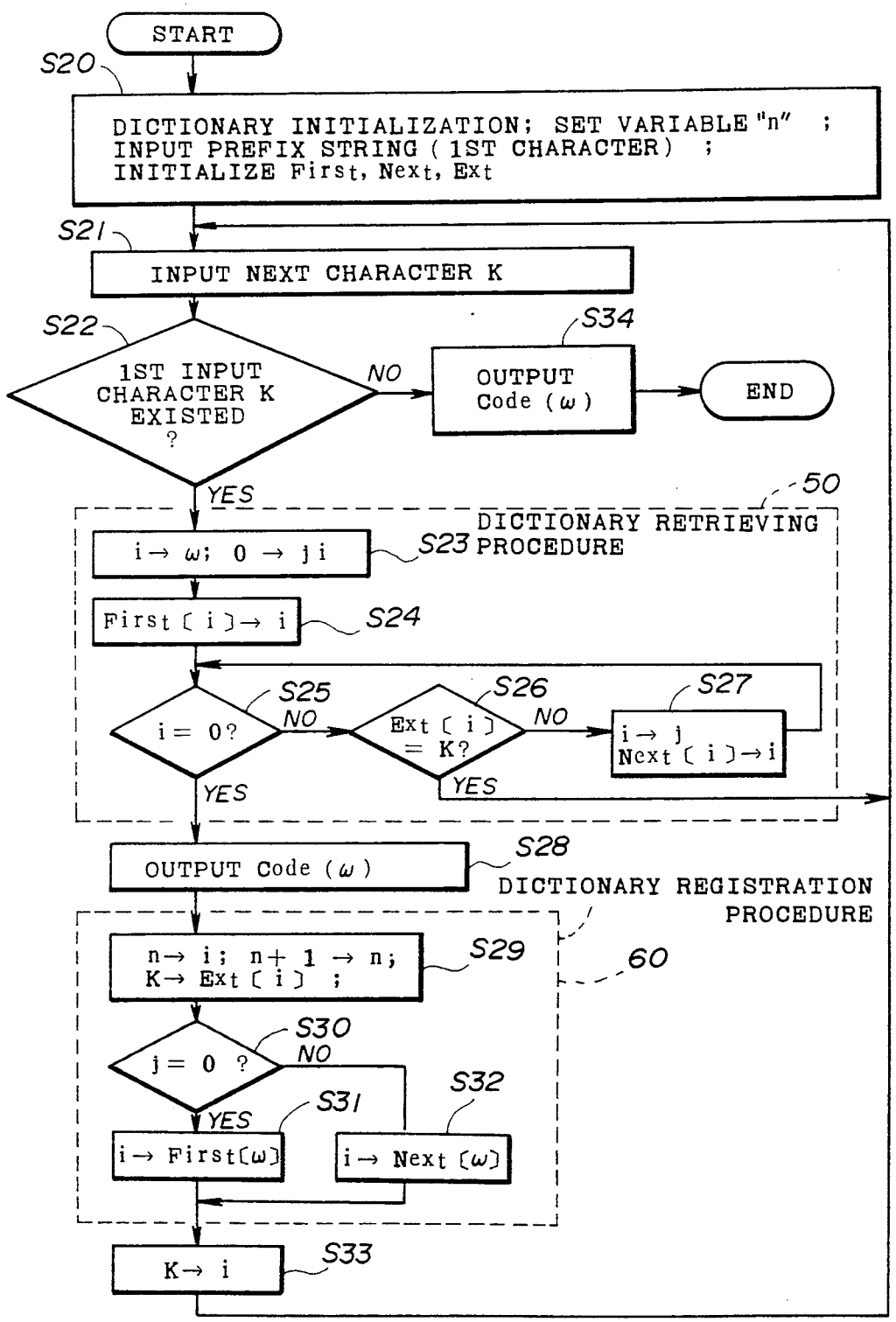
FIG. 7 is a flowchart of a conventional LZW coding procedure using the open hashing method for dictionary retrieval.
Figure 10:
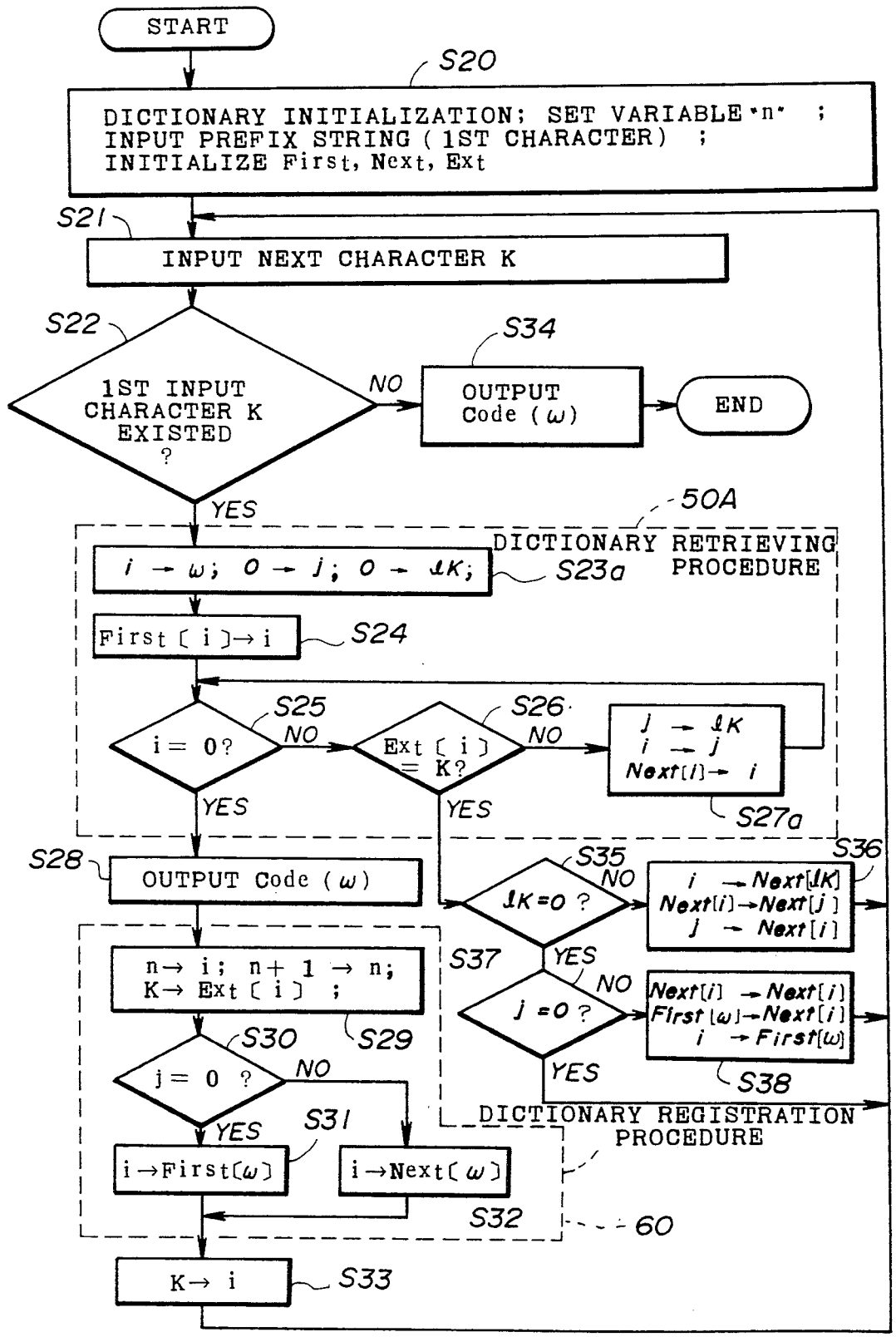
FIG. 10 is a flowchart of a coding procedure according to the first preferred of the present invention.

FIG. 10 is a flowchart of the coding procedure according to the first preferred embodiment of the present invention. In FIG. 10, those parts which are the same as those shown in FIG. 7 are given the same reference numerals. At step S20, the dictionary 220 is initialized so that each single character contained in the input character string is registered. That is, character code 1 is registered in a storage area of the dictionary 220 indicated by an address m (=1) of the dictionary 220. Then, the reference number assigned to the partial string which is next to be registered is written into the variable n. For example, the reference numbers 1, 2 and 3 respectively assigned to characters 'a', 'b' and 'c' are registered in the dictionary, and reference number 4 is written into the variable n. A maximum number of partial strings, is written into the sequences First, Next and Ext, so that sequences First[Nmax], Next[Nmax] and Ext[Nmax], each having the maximum number of partial strings, are defined. Initially, zero is written into the sequences First[Nmax], Next[Nmax] and Ext[Nmax] as the initial values. As has been described previously, the sequence First corresponds to the table 100 shown in FIG. 6, and the sequences Next and Ext correspond to the tables 101 and 10b, respectively. The ith component First[i] of the sequence First shows the number indicating a component of the sequence Ext located at the head of the list corresponding to the node indicated by the reference number i. The ith component Ext[i] of the sequence Ext shows an extension character K of an element indicated by the reference number i. Further, ith component Next[i] has a pointer indicating an element corresponding to a "brother" of the element indicated by the reference number i.

The first character K is read, and the reference number corresponding to the first character is written into the variable i. Then, the coding procedure starts. At step S21, the next (second) character subsequent to the first character is read as the extension character K. At step S22, it is determined whether or not the first input character K existed. When the result at step S22 is YES, a dictionary retrieval procedure 50A consisting of steps S23a–S27a is executed.

At step S23a, the variable i is written into the variable ω, and 0 is written into the variable j. Further, the value of the variable i is saved in a position detection index lk. At step S24, the number of the component of the sequence Next indicated by the value of the component First[i] corresponding to the variable i is written into the variable i. At step S25, when it is determined that the variable i is not equal to zero, the retrieval procedure on the corresponding list is started. This list contains candidate elements. At step S26, the component Ext[i] is compared with the extension character K. When the result at step S26 is NO, at step S27a the value of the variable i is saved in the variable j, and the component Next[i] is saved in the variable i. Further, at step S27a, the value of the variable j is saved in the variable lk. By repeatedly executing steps S25–S27a, the corresponding list is sequentially traced.

When it is determined, at step S26, that Ext[i]=K, that is, when the extension character Ext[] is the input character K, it is determined, at step S35, whether or not lk=0. When lk is not equal to 0, the input character K is found by the third linked index or a linked index after the third linked index. In this case, the aforementioned interchanging procedure is executed.

More specifically, at step S36, the value of the variable i is written into Next[lk] of the index lk, the value of the variable j is written into Next[i], and the value of the variable Next[i] is written into Next[j]. Then, the procedure returns to step S21.

On the other hand, when it is determined, at step S35, that lk=0, the input character K is found by the second link index or a link index prior to the second link index. Thus, at step S37, it is determined j=0. When j=0, the input character K is found by the component First[i], that is, the first link index. In this case, it is not necessary to interchange the positions of the adjacent partial strings in the tree structure with each other. On the other hand, when j is not equal to 0, the input character K is found by the second link index or a link index after the second link index. At step S38, the component Next[i] of the index i of the sequence Next 101 is moved to the component Next[j] of the index j immediately prior to the component Next[i], and the component First[ω] of the index ω of the sequence First 100 is moved to the component Next[i]. Further, the index i is moved to the sequence First[ω]. By the procedure at step S38, the index i of the input character K is rewritten so that it indicates the head (beginning) of the list.

On the other hand, when the component First[i] or the component Next[i] is zero, the result at step S25 is YES. In this case, it is recognized that the dictionary 220 has not registered any candidate element linked to the partial string indicated by the reference number i. In this case, a dictionary registration procedure 60 consisting of steps S29–S32 is executed.

The reference number corresponding to the partial string used at step S23 is saved in the variable ω each time the partial strings are retrieved. Thus, the reference number saved in the variable ω indicates a partial string which has been registered in the dictionary 220 and has a longest match with the input character string. At step S28, a code corresponding to the reference number ω is output, and the new partial string is registered in the dictionary 220 by the steps S29–S32.

At step S29, the value of the variable n is written into the variable i, and then incremented by 1. Further, the component Ext[i] corresponding to the variable i is set to the extension character K. At step S30, it is determined whether or not the value of the variable j is equal to zero. When the result at step S30 is YES, at step S31 the value of the variable i is written into the component First and the list corresponding to the reference number ω is defined. On the other hand, when the result at step S30 is NO, the variable i is written into the component Next [ω], the new "brother" is added to the list being considered. At step S33, the reference number corresponding to the extension character K is written into the variable i, and the procedure returns to step S21. When there is no character which is to be input, a code corresponding to the variable ω obtained at this time is output at step S34, and the procedure ends.

Figures 11A, 11B:
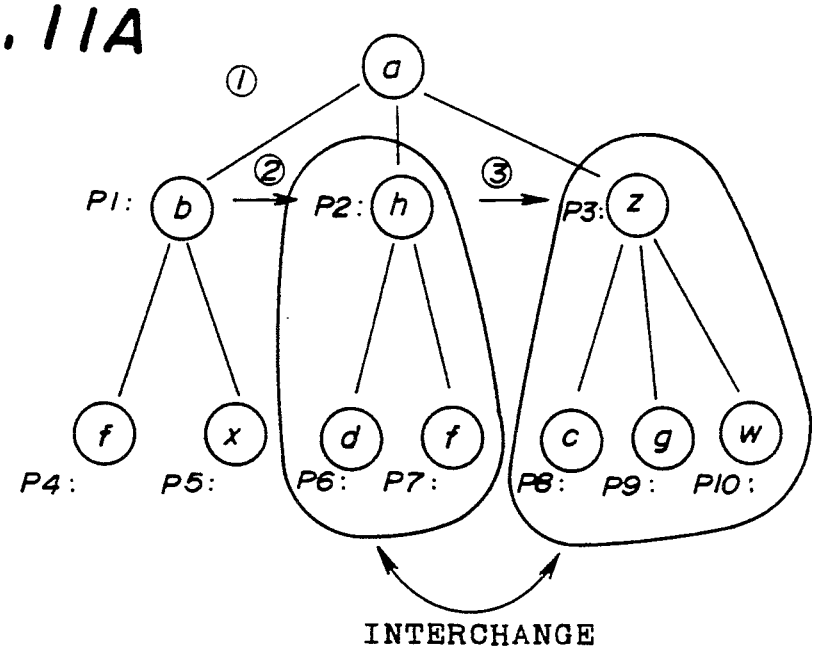
FIGS. 11A, 11B, 12A, 12B, 13A, 13B, 14A and 14B are respectively diagrams showing an example of the coding procedure according to the first preferred embodiment of the present invention.
Figures 12A, 12B:
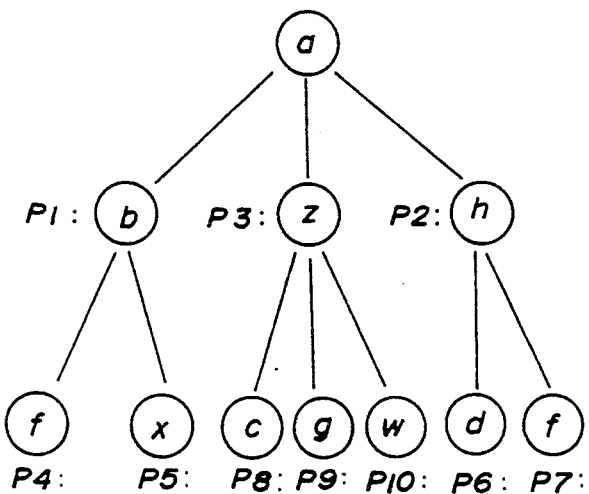

Referring to FIGS. 11A and 11B, a partial string 'azw' is searched for. The dictionary 220 shown in FIG. 9A has the partial string table 10b, and the open hash table 10a consisting of a sequence First 100 and the sequence Next 101. The character z is written into K, and the sequences First and Next are referred to, so that the component (index) Next[i=P2]=P3 is obtained. Since Ext[P3]=z at this time, j=P2 and lk=P1. Thus, it is determined, at step 35, that lk is not equal to 0, so that the tree position of the character 'z' is interchanged with that of the character 'h' immediately prior to the character 'z', as shown in FIG. 11A. That is, as shown in FIGS. 12A and 12B, i=p3 is written into the component Next[lk=P1], Next[i=P3]=0 is written into the component Next[j=P2], and j=P2 is written into the component Next[i=P3]. Further, the sequence Next[i] is written, as shown in FIG. 12B.

Figure 13A:
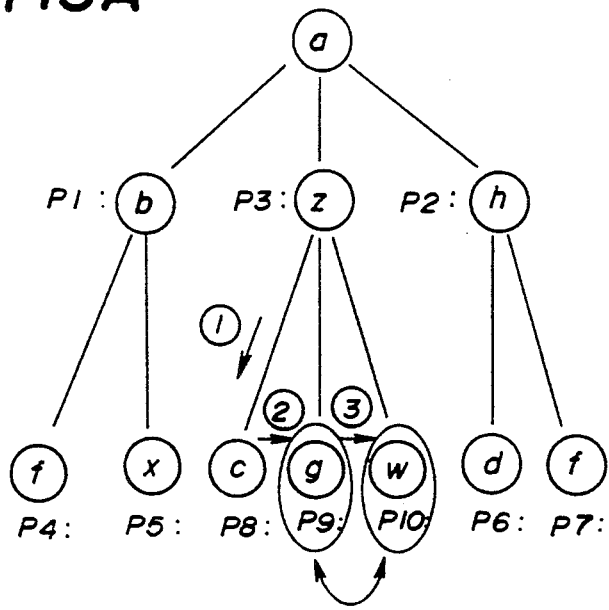
Figure 13B:
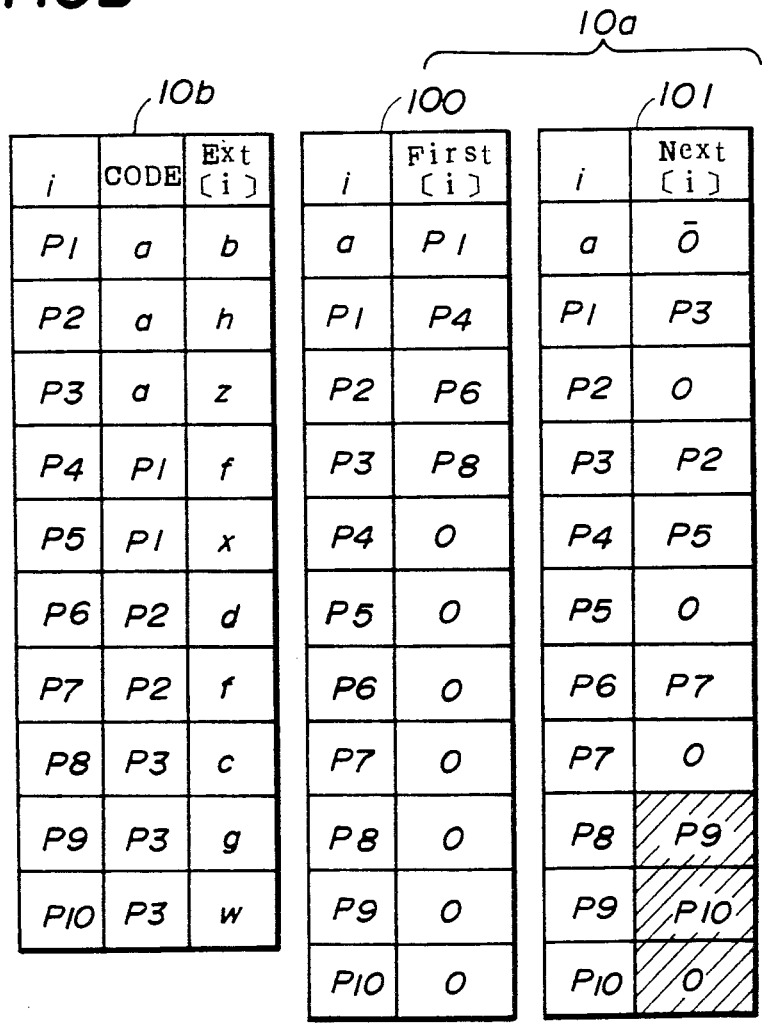
Figures 14A, 14B:
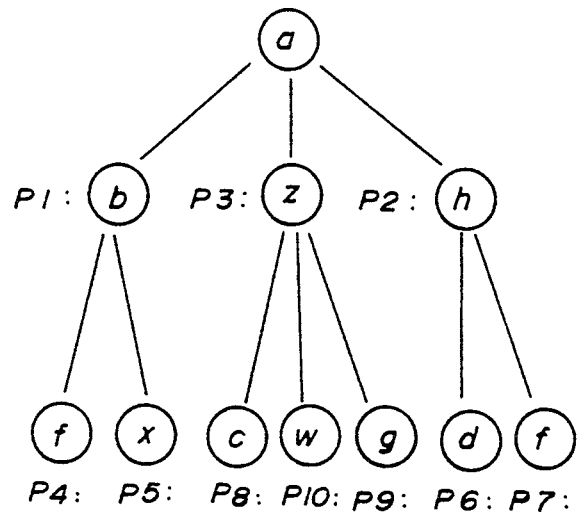

Then, the next character 'w' is input at step S21. The sequence First 100 and the sequence Next 101 are followed, as shown in FIG. 13B, so that Next[P9]=P10 is obtained as the index. At this time, Ext[P10]=w, and j=P9 and lk=P8. Thus, it is determined, at step S35, that lk is not equal to 0, so that the position of character 'w' is interchanged with that of character 'g', as shown in FIG. 13A. That is, i=P10 is written into Next[lk=P8], Next[i=P10]=0 is written into Next[j=P9], and j=P9 is written into Next[i=P10]. Thereby, as shown in FIG. 14A, the position of character 'g' is interchanged with the position of character 'w', and the sequence Next[i] is changed, as shown in FIG. 14B.

As has been described above, each time characters being retrieved are found one by one, the position of the partial string being considered is interchanged with that of the partial string which has the same hash address as the partial string being considered and which is immediately prior hereto. Thus, in the case shown in FIG. 14A, the partial strings 'azc', 'azw' and 'azg' are referred to in this order, while the partial strings 'azc', 'azg' and 'azw' are referred to in this order in the case shown in FIG. 13A. As a result, it is possible to dynamically create the dictionary on the basis of the frequency of appearance of partial strings.

Various variations of the first embodiment of the present invention can be made. It is possible to use a format of the open hash table different from that using the sequence First and the sequence Next. It is possible to process coded data strings instead of character strings.

A description will now be given of a second preferred embodiment of the present invention with reference to FIG. 8B. The tree structure shown in FIG. 8B-(I) is created by the conventional coding procedure. According to the second preferred embodiment of the present invention, the position of character 'a' indicated by * is interchanged with that of character 'b' positioned at the head of the second level extending from the character 'a' at the first level, so that the partial string 'aa' is positioned at the head of the list instead of the partial string 'ac'.

Figure 15:
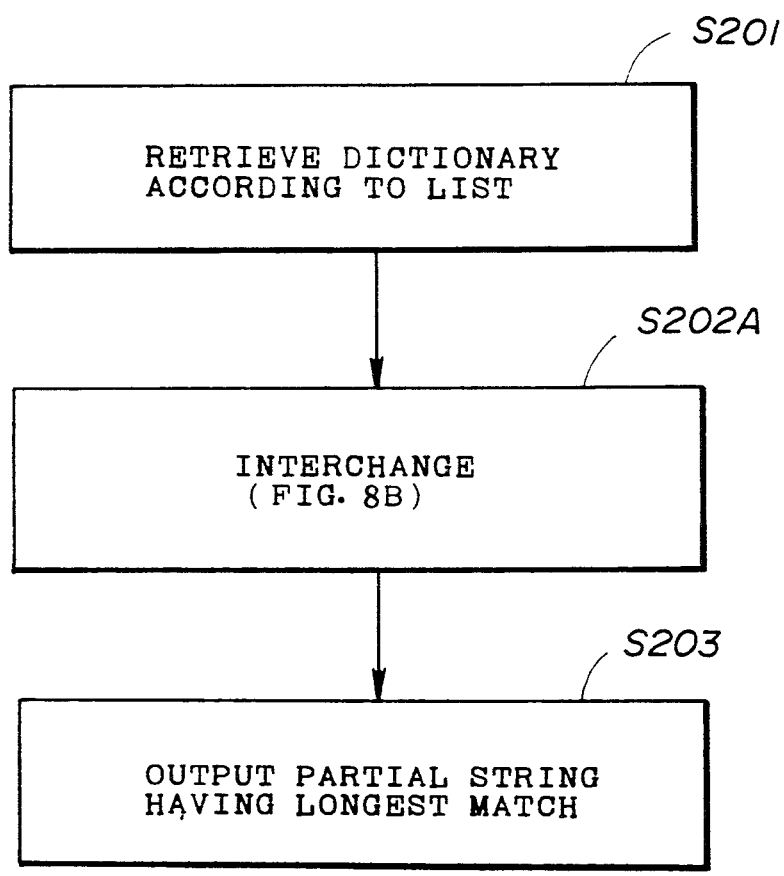
FIG. 15 is a flowchart of a coding procedure according to a second preferred embodiment of the present invention.

Referring to FIG. 15, step S202A is substituted for the aforementioned step S202 shown in FIG. 9B. At step S202A, the open hash table 10a shown in FIG. 9A is modified so that the partial string searched for is positioned at the head of the list for retrieval.

Figure 16:
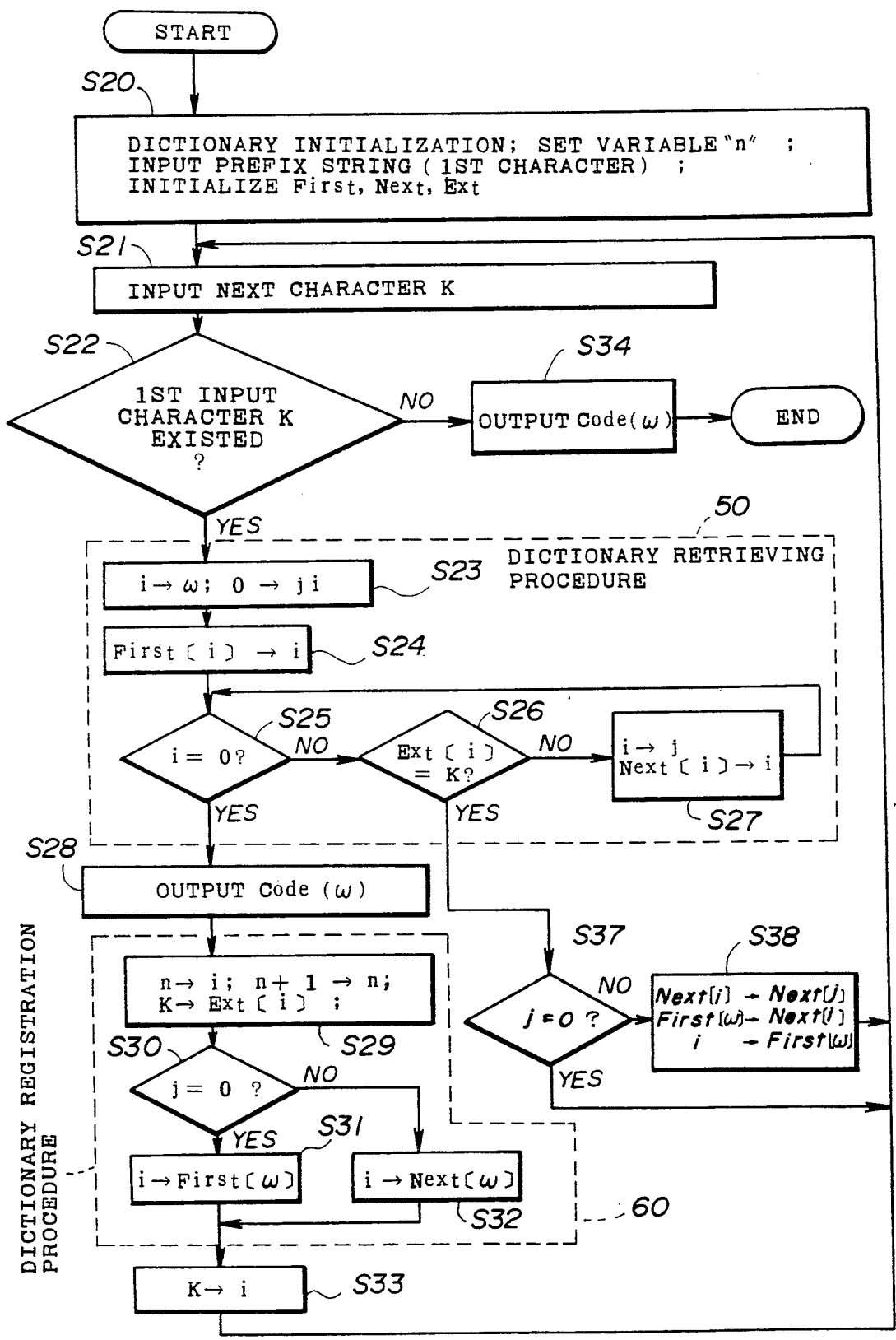
FIG. 16 is a flowchart of the coding procedure shown in FIG. 15 in more detail.

FIG. 16 is a flowchart of a coding procedure according to the second preferred embodiment of the present invention. In FIG. 16, those parts which are the same as those shown in FIG. 10 are given the same reference numerals. The flowchart in FIG. 16 is obtained by omitting the steps S35 and S36 from the flowchart of FIG. 10 and by replacing steps S23a and S27a in FIG. 10 by steps S23 and S27 shown in FIG. 7.

Figures 17A, 17B:
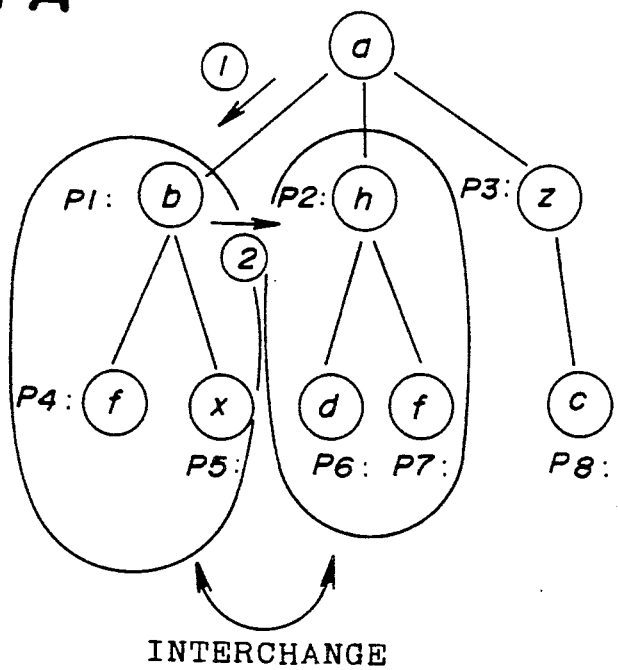
FIGS.17A, 17B, 18A, 18B, 19A and 19B, 20A and 20B are respectively diagrams of an example of the coding procedure according to the second preferred embodiment of the present invention.
Figures 18A, 18B:
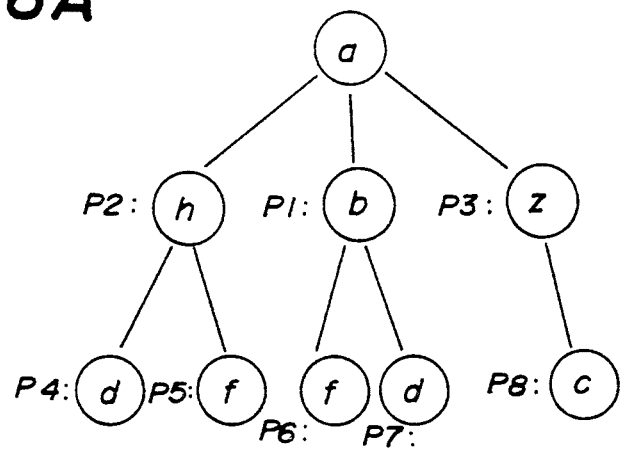

Referring to FIGS. 17A and 17B, partial string 'ahf' is searched for in the following way. In the case, the sequence First 100 and the sequence Next 101 of the open hash table 10a, and the partial string table 10b have respective data, as shown in FIG. 17B. Character 'h' is input as the input character K, and the sequences First and Next are referred to, so that the component Next[i=P1]=P2 is obtained. Since Ext[i]=h at this time, the components Next are so that i=P2 and j=P1. Thus, the partial string 'ab' is interchanged with the partial string 'ah' at step S38 shown in FIG. 16. That is, as shown in FIGS. 18A and 18B, Next[i]=P3 is written into next[j=P1], First[ω=a]=P1 is written into Next[P2], and i(=P2) is written into First [ω=a]. Thereby, the tree structure shown in FIG. 17A is modified to that shown in FIG. 18A.

Figures 19A, 19B:
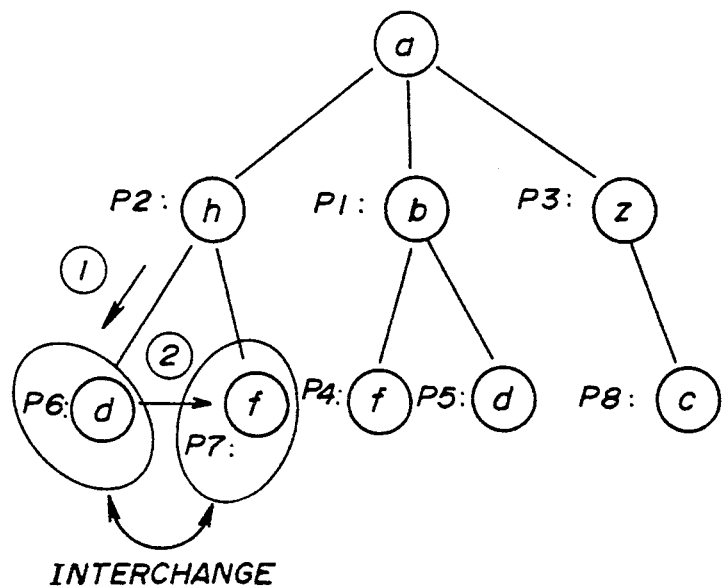
Figures 20A, 20B:
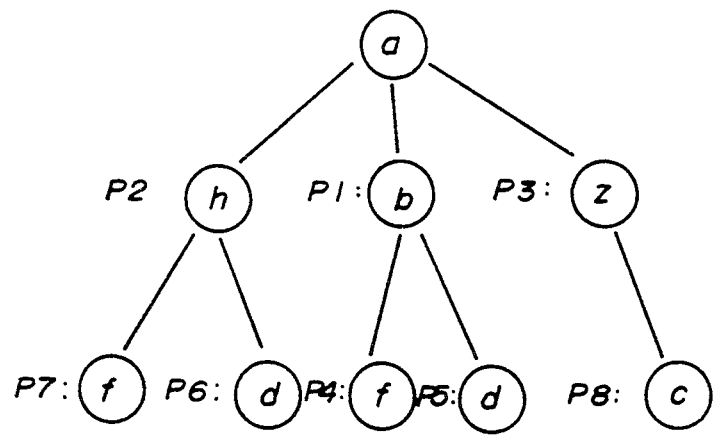

Returning to step S21, the next character 'f' is input, and the sequence First 100 and the sequence Next 101 are referred to, as shown in FIGS. 19A and 19B. Then, Next[P6]=P7 is obtained. At this time, the components Next are so that i=P7 and j=P6. Thus, the position of character 'f' in the tree structure is interchanged with that of character 'd' at step S38 shown in FIG. 16. That is, Next[i]=0 is written into Next[j=P6], First[ω=P2]=P6 is written into Next[i =P7], and i(=P7) is written into First[ω=P2]. Thereby, the tree structure shown in FIG. 18A is changed to that shown in FIG. 19A.

A description will now be given of a third preferred embodiment of the present invention. FIG. 8C shows an outline of the third preferred embodiment of the present invention. The frequency in appearance of each partial string (in other words, the number of times each partial string appears) is calculated, and the tree structure is modified based thereon. A numeral in a block attached to each character shows the frequency in appearance of each partial string. For example, as shown in FIG. 8C-(I), partial string 'ab' appears 16 times, string 'ac' appears three times, and string 'aa' appears nine times. According to the third embodiment of the present invention, as shown in FIG. 8C-(II), string 'aa' has a frequency of appearance higher than that of string 'ac'. Thus, string 'aa' is positionally interchanged with string 'ac'.

Figure 21A:
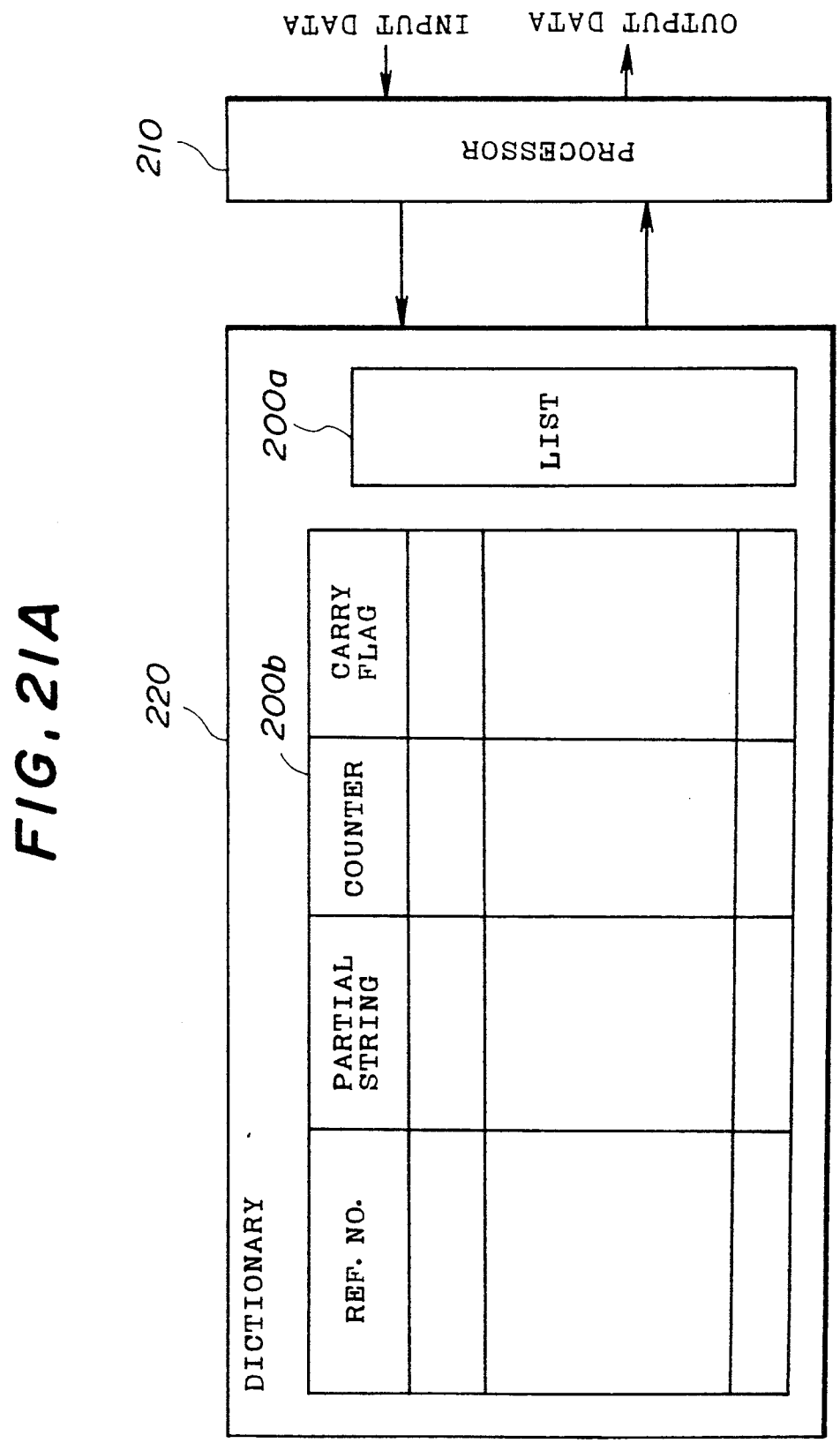
FIGS.21A and 21B are respectively diagrams showing a third preferred embodiment of the present invention.

FIG. 21A shows a system structure of the third preferred embodiment of the present invention. In FIG. 21A, those parts which are the same as those shown in the previous figures are given the same reference numerals. The dictionary memory 220 has the aforementioned open hash table 10a and a partial string table 10b'. As shown in FIG. 21A, the partial string table 10b' has a counter area and a carry flag area in addition to the aforementioned reference number (index i) and the extension character Ext[i]. The counter area stores the number of times that the corresponding partial string has been accessed. The carry flag area stores a carry flag indicating whether or not the value of the corresponding counter area has overflowed (that is, this value becomes greater than a predetermined threshold counter value).

Figure 21B:
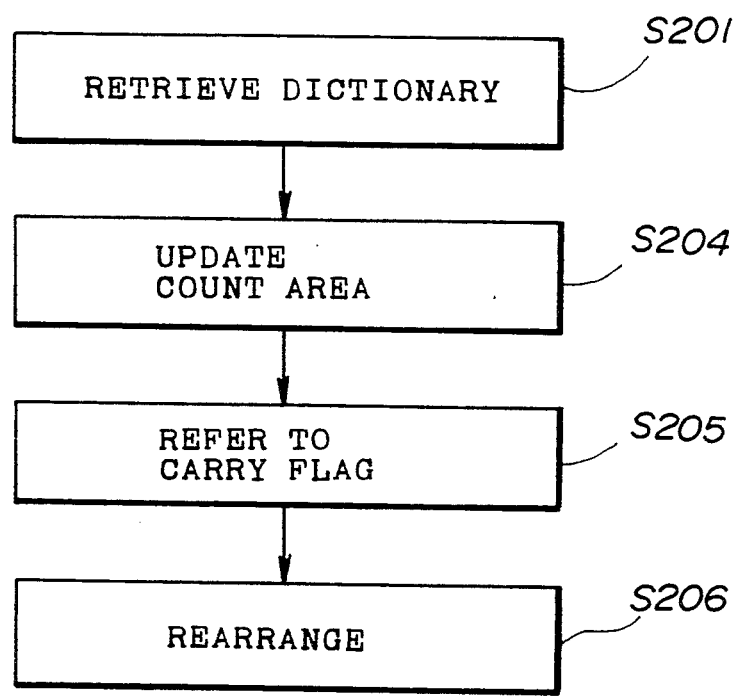

Referring to FIG. 21B, the dictionary 220 is retrieved at step S201, and the counter value in the counter area corresponding to the partial string which is searched for is incremented at step S204. At subsequent step S205, it is determined whether or not the carry flag in the corresponding carry flag area is ON. When the result of this determination is affirmative, at step S206 the positions of the corresponding partial strings in the tree structure are interchanged with each other.

Figure 22:
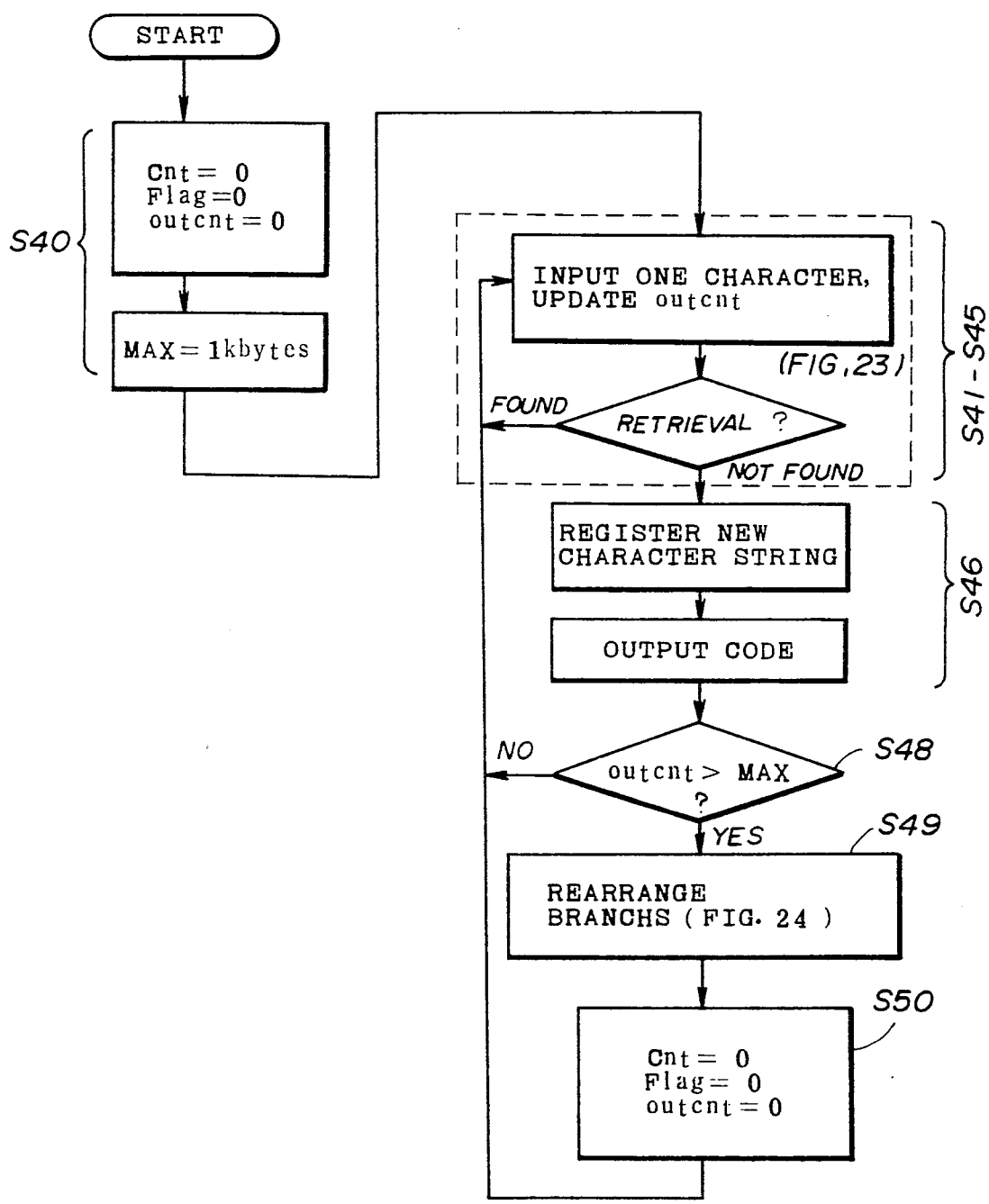
FIGS.22, 23 and 24 are respectively diagrams of a coding procedure according to the third preferred embodiment of the present invention.

FIG. 22 is a flowchart of the entire coding procedure of the third preferred embodiment of the present invention. The processor 210 resets a counter (sequence) Cnt[] and a flag Flag[] to zero at step S40. Further, the processor 210 resets a variable outcnt for counting the number of coded characters to zero. Then, a maximum value of the variable outcnt is set equal to, for example 1kbytes. After that, a retrieval procedure comprised of steps S41 to S45 is executed as shown in FIG. 23.

Figure 23:
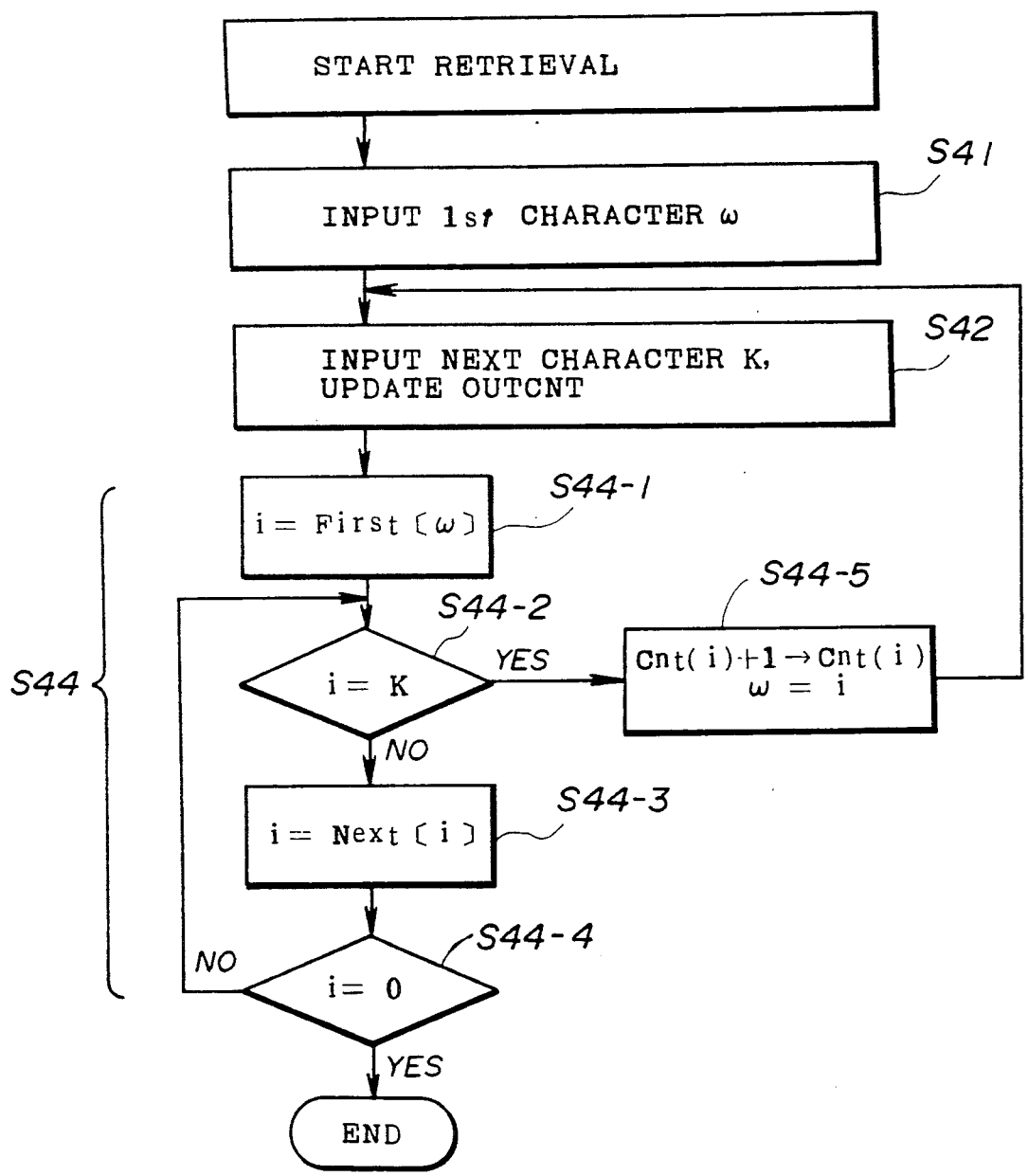

At step 41 shown in FIG. 23, the first character ω is input. The processor 210 inputs the next character K and increments the value of the variable outcnt by +1 at step S42. By the index formed of the partial string ω, the component First[ω] in the sequence First is referred to, and written into the variable i at step S44-1. At subsequent step S44-2, the index i is compared with K. When it is determined that the index i is not K, the component Next[i] of the sequence Next 101 is referred to at step S44-3. At subsequent step S44-4, it is determined whether or not i =0. When i=0, there is no candidate character. On the other hand, when i is not equal to zero, the procedure returns to step S44-2. When it is determined, at step S44-2, that i=K, it is recognized that ωk has been registered in the dictionary 220, and index i is written into the partial string ω at step S44-5. Further, at this step, the value of the counter Cnt[i] is incremented by 1, and the procedure returns to step S42. When ωK has not been registered in the dictionary 220, at step S46 shown in FIG. 22, the new partial string ωK is registered in the dictionary 220 and code Code(ω) is output.

At step S48, it is determined whether or not the value of the variable outcnt has become greater than the predetermined value MAX determined at step S40. When the result at step S48 is NO, the procedure returns to step S41. On the other hand, the result at step S48 is YES, the paths of the tree are rearranged at step S49. At subsequent step S50, the counter Cnt[], the Flag[] and the variable outcnt are reset to zero, and the procedure returns to step S41.

As has been described above, the rearrangement of the paths of the tree is carried out when the value of the variable outcnt exceeds the predetermined value MAX. The retrieval is executed along the paths of the tree, and the longest partial string which is a part of the partial string being considered is searched for. Then, the above-mentioned longest match partial string is coded at the position of the tree where it is found. When the input partial string is not identical to the already registered longest match partial string, a new partial string is registered. Then, it is determined whether or not the number of characters indicated by the variable outcnt exceeds the predetermined value MAX. When the result of this determination is affirmative, the next partial string is retrieved.

Figure 24:
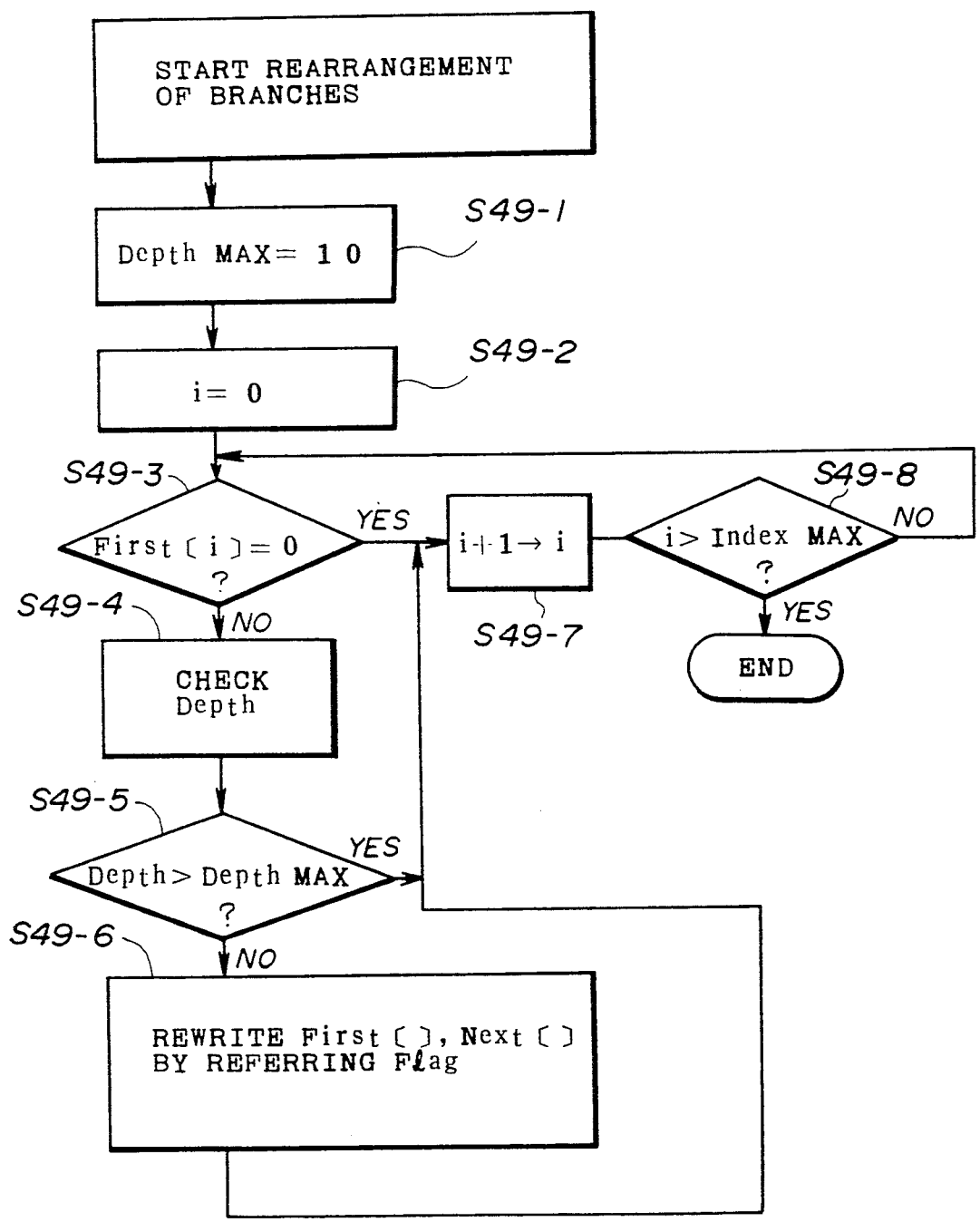

FIG. 24 shows the procedure at step S49 shown in FIG. 22 in detail. The rearrangement of the paths of the tree is carried out for a part of the tree structure in order to reduce the time necessary for the rearrangement. According to a simulation, the average depth of the tree structure is equal to 3 to 10, and it is sufficient to rearrange the paths in this range. The processor 210 shown in FIG. 21A initializes a maximum depth DepthMax to 10 at step S49-1, and the index to 0 at step S49-2. At step S49-3, it is determined whether or not the component First[i] is equal to zero. When the result at step S49-3 is NO, it is recognized that a partial string has been registered for the index being considered. Thus, the processor 210 checks the depth Depth of the partial string specified by index i at step S49-4. That is, Next[i] is sequentially followed until the component of Next[i] becomes zero, and the number of characters in the finally obtained partial string is obtained from index i. At step S49-5, the depth Depth obtained at step S49-4 is compared with the maximum depth DepthMax. When Depth > DepthMax, the tree is too deep and the procedure proceeds to step S49-7 without executing the rearrangement process. On the other hand, when the result at step S49-5 is NO, the flag Flag[] is referred to, and the sequences First[] and Next[] are rewritten.

Figure 25B:
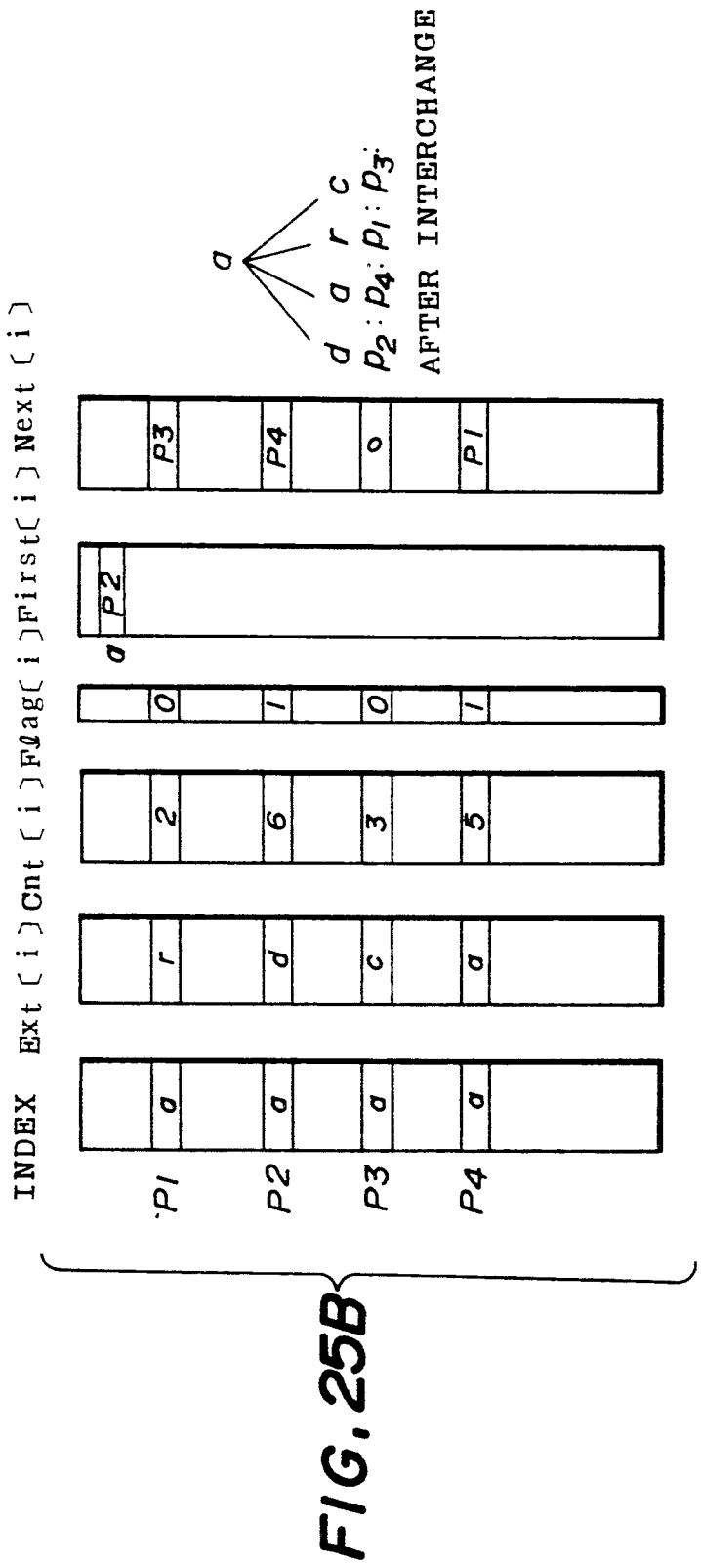

The process at step S49-6 will now be described with reference to FIGS. 25A and 25B. It is now assumed that the tree has partial strings 'ar', 'ad', 'ac' and 'aa' which appear in this order. In this case, the respective values of the counter Cnt[i] are 2, 6, 3 and 5. If the flag Flag[] are respectively 0, 1, 0 and 1, 'ad' and 'aa' which have high frequencies of appearance is forwardly shifted, so that the table shown in FIG. 25A is rearranged as shown in FIG. 25B. That is, the component First[a] is changed to P2 from P1, the component of next[p2] is changed to P4, the component of Next[P3] is changed to 0, and the component of Next[P4] is changed to P1. As a result of this rearrangement, the trees is followed in an order of P2, P4, P1 and P3. Then, the procedure proceeds to step S49-7.

When it is determined, at step S49-3, that First[i]=0, it is recognized that there is no registered partial string with respect to this index, the index i is incremented by 1 at step S49-7. At step S49-8, the index i is compared with the maximum value IndexMax. When the result is NO, the procedure returns to step S49-3. On the other hand, when the result is YES, it is recognized that all the registered characters are rearranged, and the procedure ends.

A description will now be given of a fourth preferred embodiment of the present invention. FIG. 8D shows an outline of the fourth preferred embodiment of the present invention. According to the fourth embodiment, the candidate elements (characters or partial strings) are grouped based on information (for example, the most significant bit) about the input extension character contained in each partial string being searched for. Conventionally, as shown in FIG. 8D-(I), partial string 'cd' is searched for via paths as indicated by arrows. It is now assumed that 'a', 'b', 'c' and 'd' are 00, 01, 10 and 11, respectively. These characters are grouped based on the most significant bits thereof. The characters 'a' and 'b' have the same most significant bits ("0"), and are grouped in the same group. Similarly, the characters 'c' and 'd' have the same most significant bits ("1"), and are grouped in the same group. When the strings 'cd ...' is input, the most significant bit of its second character 'd' is "0", then partial strings 'cc' is referred to first, and partial string 'cd' is referred to second. It can be seen from (I) and (II) of FIG. 8D that the number of paths followed for retrieval in the case (II) is extremely smaller than that in the case (I). The average number of paths followed for retrieval in the case (II) is approximately half of that for the case (I).

Figure 26:
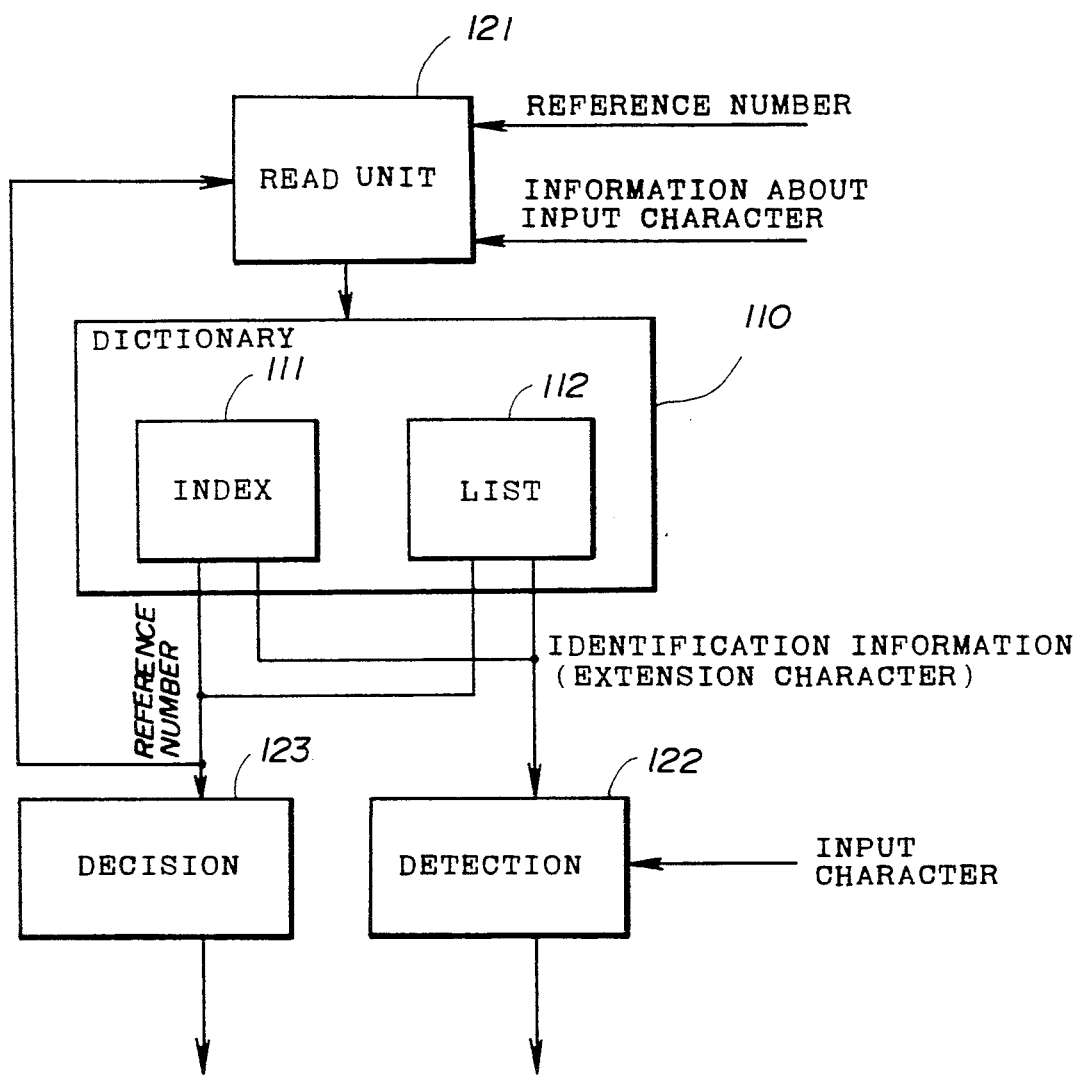
FIG. 26 is a block diagram of a system according to a fourth preferred embodiment of the present invention.

FIG. 26 shows a system of the fourth preferred embodiment of the present invention. The system in FIG. 26 is composed of a dictionary 110 having an index table 111 and a list table 112, a read unit 121, and a detection unit 122 and a decision unit 123. In the fourth embodiment, the sequence First corresponds to the index table 111, and the sequences Next and Ext correspond to the list table 112. The read unit 121 inputs the reference number i and information about the input character (which corresponds to, for example, the bit or bits of the input extension character) when the reference number of the partial string obtained by adding the extension character K to the reference number i is obtained by the open hashing method. Then, the read unit 121 retrieves the dictionary 110 by the hash address which corresponds to a value which is obtained by adding the information about the extracted information about the input character to the reference number. The list table 112 stores candidate characters in such a way that the buckets of the linked lists are grouped in accordance with the bit values of the input character. At the commencement of the coding procedure, the read unit 121 outputs, to the dictionary 110, the reference number and the extension character registered in the index table 111 in accordance with the input reference number and the information about the input character. After that, the read unit 121 outputs, to the dictionary 110, the reference number and extension character registered in the list table 112 in accordance with the reference number read out from the dictionary 110. In this way, by using the index table 111 first and the list table 112 second, the extension characters sequentially linked by the pointers are sequentially read out from the dictionary 110.

When the extension character read out, as the identification information, from the dictionary 110 coincides with the input character, the detection unit 122 generates a match detection signal. When the reference number read out from the dictionary 110 is different from any of the partial strings registered in the dictionary 110, the decision unit 123 determines that all the candidate elements have been read, and generates a signal showing this result.

According to the above-mentioned fourth preferred embodiment, the candidate elements corresponding to the respective reference numbers are grouped based on the information about the extension character, and the group specified by the input reference number and the information about the extension character is retrieved. With this arrangement, it is possible to efficiently retrieve the dictionary 110 at a higher speed. Further, the read unit 121, the detection unit 123 and the decision unit 124 operate independently, so that the dictionary 110 can be retrieved at a higher speed.

An alternative operation of the system shown in FIG. 26 can be made. In this alternative, the read until 121 reads the dictionary 110 at predetermined intervals. The detection unit 122 and the decision unit 123 operate in parallel to the read operation of the read unit 121. For example, the read unit 121 executes the read operation at intervals necessary to read the dictionary 110. Normally, the detection operation of the detection unit 122 and the decision operation of the decision unit 123 completes during a short time, so that the retrieving procedure can be executed in a pipeline manner by executing the read operation, detection operation and the decision operation in parallel, that is, simultaneously.

Figure 27:
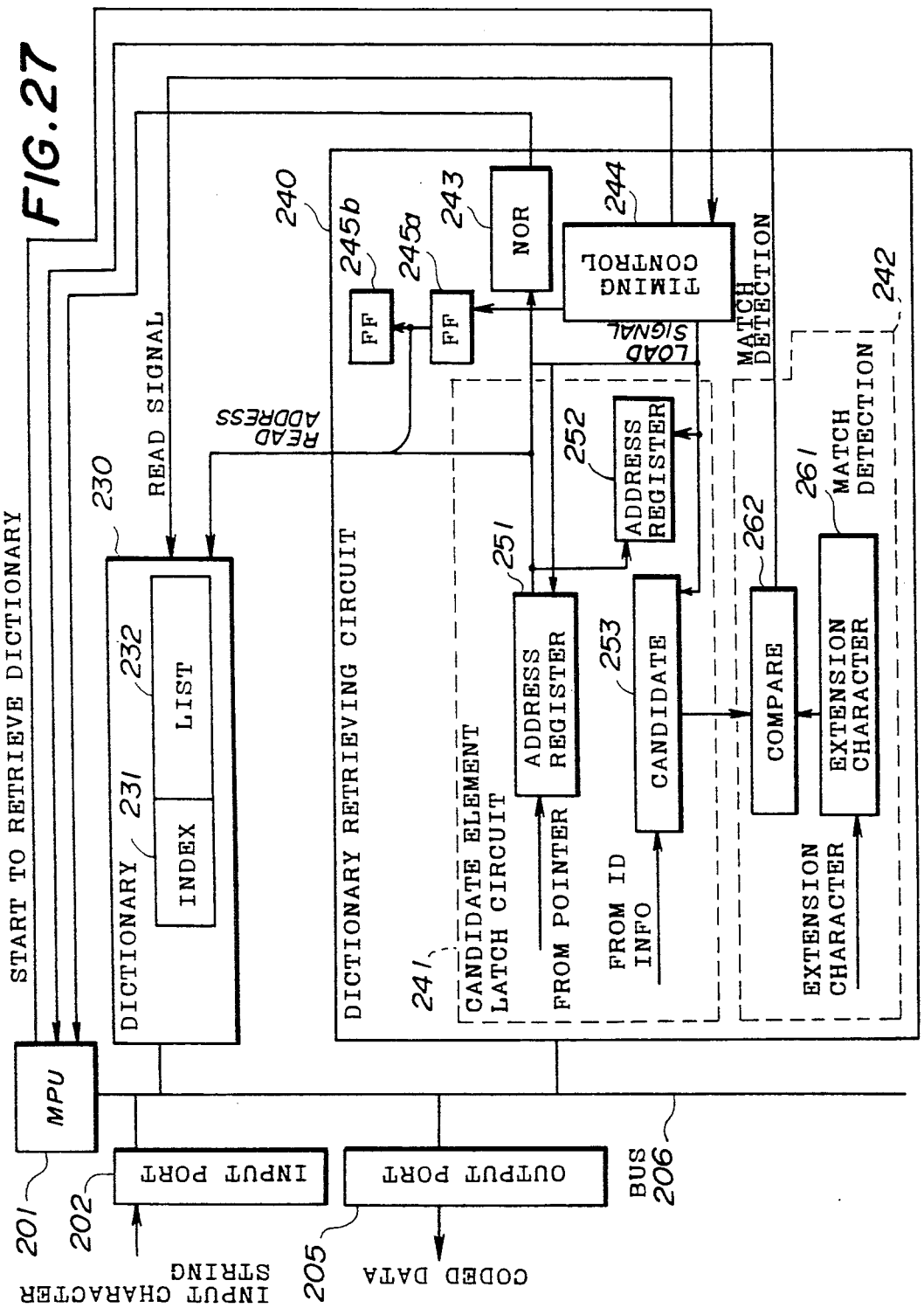
FIG. 27 is a block diagram showing th system shown in FIG. 26 in more detail.

FIG. 27 shows the system shown in FIG. 26 in more detail. The configuration shown in FIG. 27 corresponds to that shown in FIG. 26 as follows. The dictionary 110 corresponds to a dictionary 230. The index table 111 corresponds to an index table 231, and the list table 112 corresponds to a list table 232. The read unit 121 corresponds to a candidate element latch circuit 241, a timing control circuit 244, and a flip-flop (FF) 245a. The detection unit 122 corresponds to an extension character register 261 and a comparator circuit 262. The decision unit 123 corresponds to a NOR circuit 243.

The system includes a microprocessor (MPU) 201, an input port 202, the dictionary 230, a dictionary retrieving circuit 240, and an output port 205. The MPU 201, the input port 202, the dictionary 230, the dictionary retrieving circuit 240 and the output port 205 are mutually connected via bus 206. The character string input via the input port 202 is LZW-coded by the MPU 201, transferred, via the output port 205, to a storage device (not shown) such as a magnetic disk drive and stored therein. During this operation, the MPU 201 instructs the dictionary retrieving circuit 240 to retrieve a part of the currently processed input character string stored in the dictionary 230.

In the LZW coding, the partial string is represented by the reference number $\omega$ assigned to the already retrieved partial string and one input extension character K added to the partial string. Thus, the dictionary retrieving circuit 240 searches for a partial string with the input extension character K added from candidate elements obtained by respectively adding, as the extension characters, the mutually different one-characters Ext to the head of the previously encountered partial string (represented by the reference number) being considered. In this case, the partial string being considered belongs to the group having candidate elements, each having, as the extension character Ext, the character having the most significant bit identical to the most significant bit $K_m$ of the aforementioned input extension character K. Thus, the candidate elements are grouped into two groups on the based of the most significant bit of the extension character of each of the candidate elements, and the candidate elements belonging to the group corresponding to the most significant bit $K_m$, so that the aforementioned partial string being considered can be searched for in the corresponding group.

Figure 28:
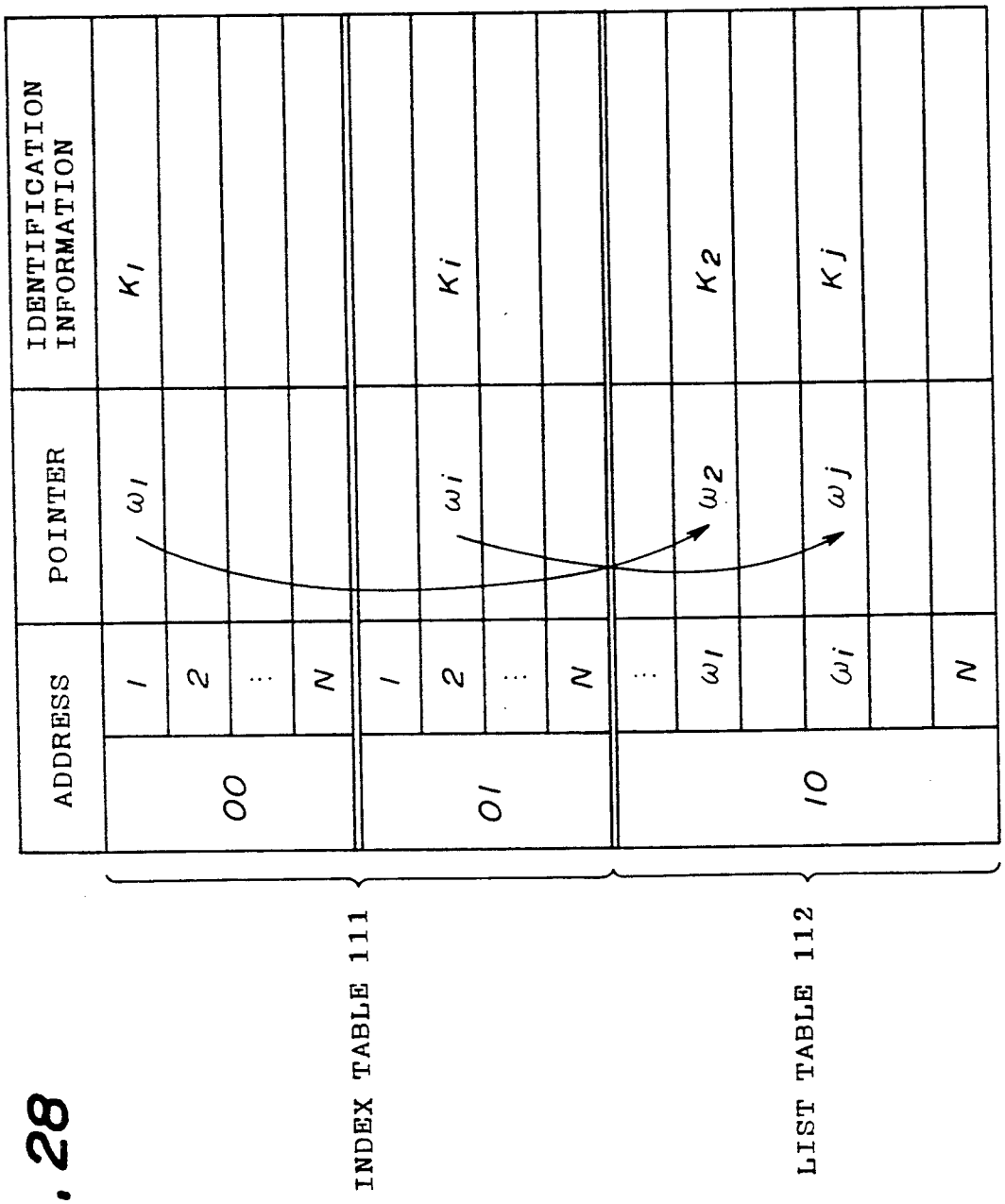
FIG. 28 is a diagram showing the content of a dictionary used in the system shown in FIG. 27.

FIG. 28 shows the format of the dictionary 230 in conformity with a retrieval procedure in which the candidate elements are grouped into two on the basis of the most significant bit of the extension character. The dictionary 230 is composed of 3N consecutive storage areas. The content of the storage area specified by a read address is read out from the dictionary 230 in response to a read signal applied thereto.

Out of the 3N storage areas, a storage area having two high-order bits equal to 00 and a storage area having two high-order bits equal to 01 are assigned to the index table 231. A storage area having two high-order bits equal to 10 is assigned to the list table 232 having linked lists. The remaining storage area of each of the index table 231 and the list table 232 has a pointer part indicating the candidate element linked to the partial string having the reference number consisting of the low-order bits other than the above-mentioned two high-order bits, and an identification information part storing identification information about the candidate elements.

The reference number of a partial string obtained by adding one character having the most significant bit of the address of the index table 231 equal to 0 to the partial string having the reference number consisting of the low-order bits of the address is stored, as the pointer, in the pointer part in the area having the two high-order bits of the address equal to 00 (which is referred to as index table area $231_{00}$). The reference number of a partial string obtained by adding the partial string having the reference number consisting of the low-order bits of the address to one character having the most significant bit equal to 1 is stored, as the pointer, in the pointer of the area having the two high-order bits equal to 01 (index table area $231_{01}$). In the above-mentioned way, each candidate element obtained by adding, as the extension character, one character to the partial string of the reference number is registered in either the index table area $231_{00}$ or $231_{01}$ on the basis of the most significant bit of the extension character. The pointer part of each area of the list table 232 stores the reference number assigned to the partial string having the same most significant bit as that of the extension character and having the remaining bits different from the other partial strings. The identification information part of each of the index table 231 and the list table 232 stores, as identification information, the extension character of each candidate element. In this way, the mutual linkage relationship between the candidate elements in the same group having the extension characters having identical high-order bits. In FIG. 28, the linkage relationship between the candidate elements ($\omega_1$ and $\omega_2$), each having the extension character having the most significant bit equal to 0 is shown in the partial string having the reference number 1, and the linkage relationship between the candidate elements ($\omega$hd 1 and $\omega_j$), each having the extension character having the most significant bit equal to 1 is shown in the partial string having the reference number 2. The contents of the index table 231 and the list table 232 are initially set to zero before starting the coding procedure.

The dictionary retrieving circuit 240 includes the candidate element latch circuit 241, the match detection circuit 242, the NOR circuit 243, the timing control control circuit 244, two flip-flops 245a and 245b. Data output from the index table 231 and the open hashing table 232 via the bus 206 are latched in the latch circuit 241, which is composed of two address registers 251 and 252, and a candidate character register 253. The pointer part of the data transferred via the bus 206 is input to the address register 251, and the identification information part thereof is input to the candidate character register 253. The bits other than the most significant bit of the output of the address register 251 are input to the address register 252 and temporarily latched therein. The above-mentioned registers store the data in response to a load signal output by the timing control circuit 244.

The match detection circuit 242 is composed of an extension character register 261 which stores the input extension character K, and the comparator circuit 262 which compares the input extension character K in the extension character register 261 with the candidate character in the candidate character register 253. The comparator circuit 262 generates a value (logic) "1" when both the characters coincide with each other. The output of the comparator circuit 262 is input to the MPU 201 as the match detection signal.

The NOR circuit 243 is supplied with the output of the address register 251, and the output of the NOR circuit 243 is input to the MPU 201. The timing control circuit 2434 operates in response to the instruction from the MPU 201 so that it controls the flip-flop 245a and generates the read signal and the load signal. The read signal is input to the dictionary 230, and the load signal is input to the address registers 251 and 252 and the candidate character register 253 of the candidate element latch circuit 241.

The output of the flip-flop 245a is input to the flip-flop 245b, and supplied, as the most significant bit of the read address, to the dictionary 230. The output of the address register 251 of the candidate element latch circuit 241 is supplied, as the low-order part of the read address, to the dictionary 230.

Figure 3:
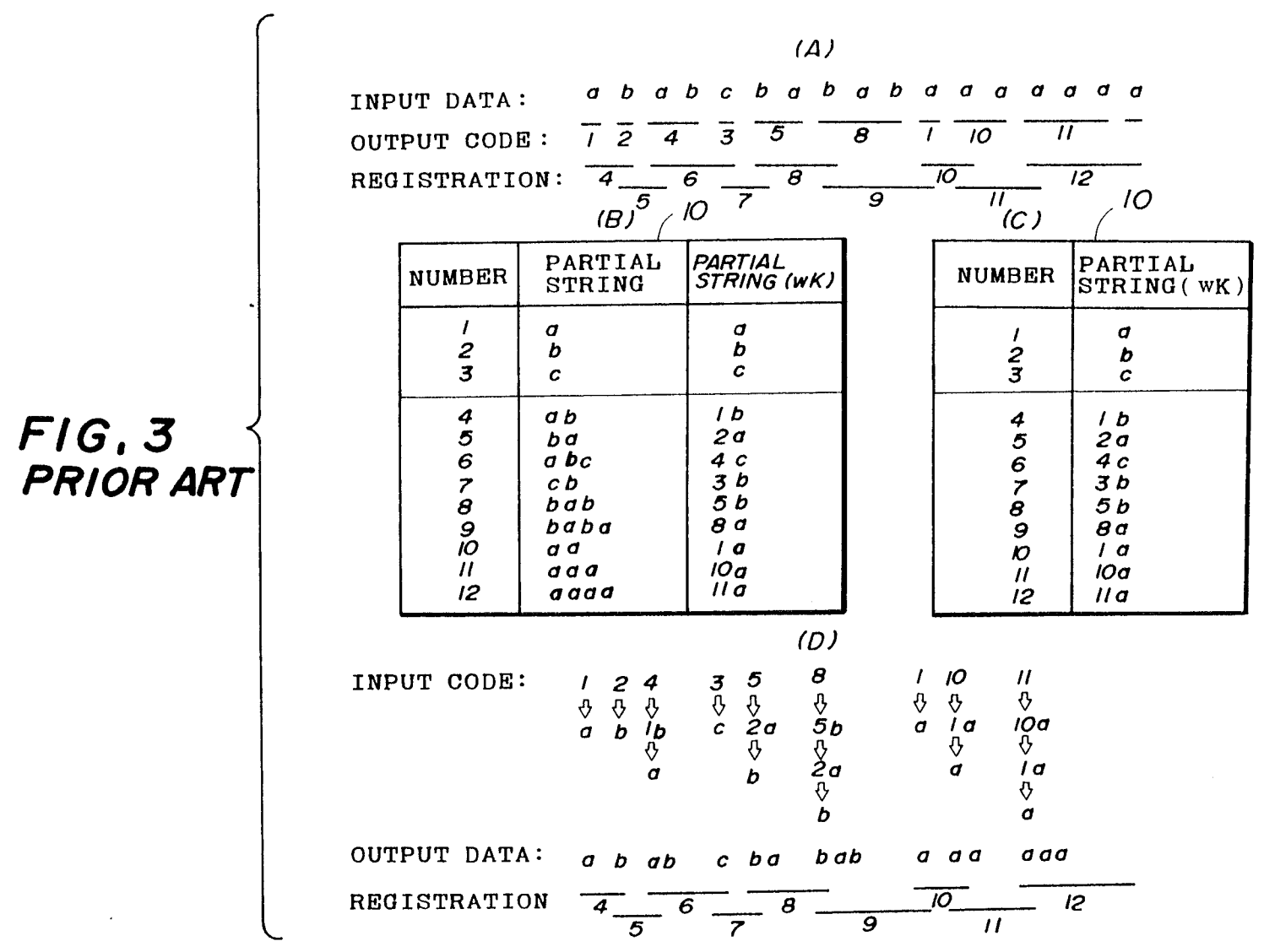

A description will now be given of the retrieval operation on the dictionary 230 carried out under the control of the dictionary retrieving circuit 240. When the character string shown in FIG. 3A is coded, the first character 'a' is read, and placed at the head of the partial string being considered. At this time, the corresponding reference number ("1" for example) is obtained. After that, the next character 'b' is read and set as the extension character K. The hash address obtained by adding the most significant bit of the extension character 'b' to the above-mentioned reference number is registered in the address register 251. The character 'b' is registered, as the extension character K, in the extension character register 261. Then, the timing control circuit 244 is instructed to start the retrieval operation.

In response to the start instruction, the timing control circuit 244 resets the value of the flip-flop 245a to zero, and outputs the dictionary 230 to the read signal. Thus, the logic value "0" is input, as the most significant bit of the read address, to the dictionary 230, and the corresponding table area of the index table 231 formed in the dictionary 230 is selected. In accordance with the most significant bit of the content of the address register 251, either the index table area $231_{00}$ or $231_{01}$ is selected. Then, data in the storage data having the reference number $\omega$ in the selected index table area $231_{00}$ or $231_{01}$ is input to the dictionary retrieving circuit 240 via the bus 206. In this way, the extension character of the first candidate element and the pointer indicating another candidate element linked to the first candidate element are read out from the index table 231 and written into the registers 253 and 251, respectively.

The timing control circuit 244 outputs the load signal to the address registers 251 and 252, and the candidate character register 253 after the elapse of time (read cycle time) $\tau$ necessary to read data from the dictionary 230 in response to the read signal. In response to the load signal, the pointer read out from the pointer part of the corresponding storage area of the index table 231 is registered in the address register 251. At this time, the timing control circuit 244 sets the flip-flop 245a to "1". During the following process, the most significant bit of the read address is "1", and the list table 232 of the dictionary 230 is selected, and the next candidate element linked by the pointer is read out from the storage area of the list table 232 indicated by the readout pointer.

After this, the timing control circuit 244 outputs the read signal until a special instruction is received from the MPU 201, and repeatedly outputs the read signal after the elapse of the read cycle time $\tau$. In this way, the candidate elements linked by the pointer are sequentially read out from the open hashing table 232. The reference number immediately previously read out as the pointer is latched in the address register 252, and the most significant bit of the read address specified at the time of the immediately previous read operation is latched in the flip-flop 245b. In this way, the candidate elements which belong to the group corresponding to the most significant bit Km of the extension character K are sequentially read out one by one for every read cycle time $\tau$.

The match detection circuit 242 operates independent of the candidate element latch circuit 241. Thus, the comparator circuit 262 compares, in parallel to the read operation, the character previously read and latched in the candidate character register 253 with the extension character K.

As has been described previously, the comparator circuit 262 outputs "1" to the MPU 201 when the candidate character coincides with the extension character. Thus, when "1" is input to the MPU 201, it recognizes that the object partial string is searched for, and executes an interruption procedure which will be explained below.

In this case, the MPU 201 instructs the timing control circuit 244 to stop the read operation, and reads the reference number latched in the address register 252. The reference number corresponds to the partial string immediately previously read out, that is, the partial string which is determined, by the match detection circuit 242, to be coincident to the partial string being considered. In this case, the MPU 201 reads the next one-character of the input character string as the new extension character K, and writes it in the extension character register 261. Further, the MPU 201 writes the most significant bit of the above new extension character K as well as the above-mentioned reference number in the address register 252, and instructs the dictionary retrieving circuit 240 to start to retrieve the related partial strings.

In this way, each time the partial string identical to the partial string being considered is searched for, the partial string being considered is extended by adding the next input character to the previously encountered partial string, and is searched for, so that the input character string is coded.

In the same way as the match detection circuit 242, the NOR circuit 243 operates independent of the candidate element latch circuit 241. In parallel to the read operation, the NOR circuit 243 determines whether or not an effective pointer other than "0" is stored in the address register 251, whereby it is determined whether or not the linked candidate element exists. When the NOR circuit 243 generates "1", which means that there is no linked candidate element, the MPU 201 executes the following interruption procedure.

First, the MPU 201 instructs the timing control circuit 244 to stop the reading operation, and outputs, as a code, the reference number $\omega$ corresponding to the partial string lastly searched for. Then, the MPU 201 reads the reference number latched in the address register 252 and the output of the flip-flop 245b, and executes the procedure for registering the new partial string on the basis of the output of the flip-flop 245b. For example, when the output of the flip-flop 245b is "0", the new partial string is registered in the index table 231. In this case, the reference number $\omega_n$ assigned to the partial string obtained by adding the extension character K to the partial string corresponding to the reference number $\omega$ is written, as the pointer, into the storage area of the index table 231 specified by the most significant bit Km of the extension character K and the above reference number, and the extension character is registered therein as the identification information. In this way, the first candidate element which belongs to the group corresponding to the reference number $\omega$ and the most significant bit Km of the extension character is registered.

Meanwhile, when the output of the flip-flop 245b is "1", the MPU 201 registers the new partial string in the list table 232 with the most significant bit of the write address set equal to "1". In this case, the above-mentioned reference number $\omega n$ is written, as the pointer, into the storage area of the open hashing table 232 corresponding to the above-indicated pointer, and the extension character K is registered therein as the identification information. In this way, the new candidate element which belongs to the group corresponding to the above-mentioned reference number $\omega$ and the most significant bit Km of the extension character K is registered.

Then, the coding procedure continues in such a way that the extension character K is set as the head of the partial string being considered, and the next one-character of the input character string is set as the new extension character.

As has been described previously, the linkage relationship between the candidate elements having the identical most significant bit values is shown by the pointers in the storage areas of the index table 231 and the list table 232, and the candidate elements are grouped based on the most significant bit of the extension characters.

When the probability of appearance of "1" is equal to that of appearance of "0", each of the two divided groups has the same number of candidate elements. Thus, according to the fourth preferred embodiment of the present invention, it is possible to reduce the number of candidate elements to be retrieved to half the number of candidate elements processed by the conventional coding procedure, so that the retrieving operation can be executed at a higher speed.

Further, the data is read out from the dictionary 230 at intervals $\tau$, and the match detection unit 242 and the NOR circuit 243 operate independently of the candidate element latch circuit 241, so that the linked candidate elements can be retrieved without the MPU 201. Further, the read operation, match detecting operation and the decision operation can be simultaneously executed in the pipeline procedure. According to the fourth preferred embodiment, it becomes possible to transfer coded data to the storage device, such as a magnetic disk drive, in real time. Moreover, since the MPU 201 executes the aforementioned interruption procedures in response to the outputs of the match detection circuit 242 and the NOR circuit 243, it is not necessary for the MPU 201 to operate at an extremely high speed.

The fourth preferred embodiment of the present invention is not limited to the specifically disclosed arrangement. It is possible to use a different number of grouped blocks and a procedure for grouping the candidate elements. For example, it is possible to group the candidate elements into four groups on the basis of two high-order bits of the extension character. It is also possible to group the candidate elements on the basis of the number of binary zeros or ones contained in the bit pattern of the extension character. When the number of binary zeros is larger than that of binary ones, the corresponding candidate element is grouped in a first group, and grouped into a second group when the number of binary zeros is smaller than that of binary ones. Further, it is possible to use a look-up table which stores logic "1" or "0" in accordance with the bit pattern of the extension character and group the candidate elements in a first group defined by logic "1" and a second group defined by logic "0". Even when any dividing condition is used, it is required that each group has almost the same number of candidate elements.

In the case where part of the bit pattern of the extension character is included in the hash address, it is sufficient to register, as the identification information of each candidate element, only the remaining part of the bit pattern of the extension character in the dictionary 230. With this arrangement, it is possible to suppress an increase in the memory capacity necessary to build the dictionary 230.

Figure 29:
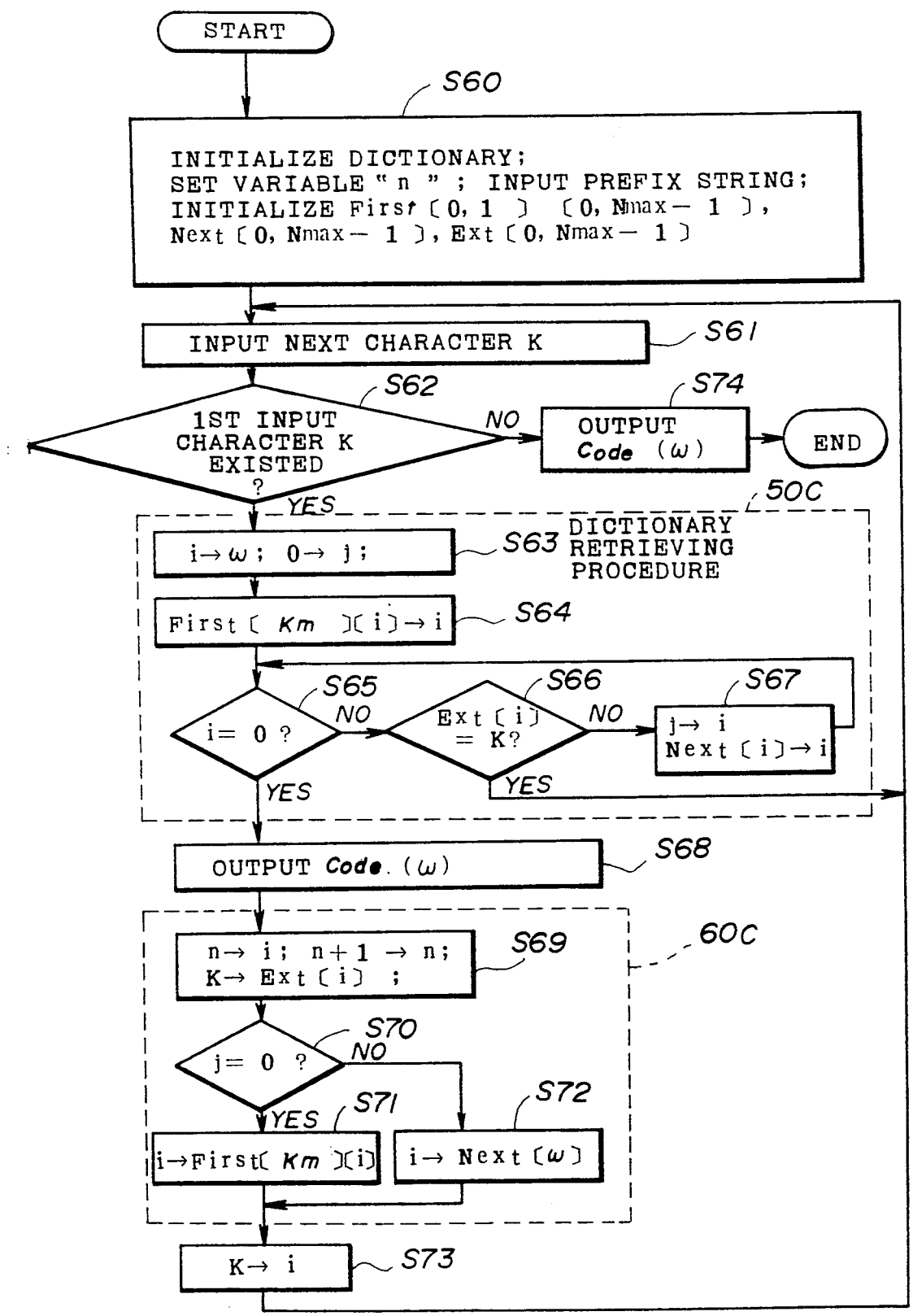
FIG. 29 is a flowchart of a coding procedure according to the fourth preferred embodiment of the present invention.

FIG. 29 is a flowchart of the coding procedure according to the fourth preferred embodiment of the present invention. At step 60 in FIG. 29, the dictionary 110 is initialized so that each one-character contained in an input character string is registered together with the corresponding reference number, the reference number n is set, and the first character of the input character string is set as the prefix string. Further, sequences First[0,1][Nmax−1], Next[0,Nmax−1] and Ext[0,-Nmax−1] are initialized so that they respectively show "0". The sequence First[0,1][Nmax−1] is a two-dimensional sequence in which the first argument assumes 0 or 1 and the second argument assumes a value between 0 and Nmax−1. The sequence Next[0,Nmax−1] is a one-dimensional sequence, and the sequence Ext[0,-Nmax−1] is also a one-dimensional sequence.

At step S62, the next character is read, and it is determined, at step S63, whether or not the first input character K existed. When the result at step S74 is NO, a code Code($\omega$) is output. On the other hand, when the result st step S62 is YES, a dictionary retrieving procedure 50C is executed. At step S63, the value of the variable i is saved in the variable $\omega$, and "0" is written into the variable j. At step S64, the component First[Km][i] is written into the variable i where Km denotes the most significant bit of the extension character K, which is equal to 1 or 0. At step S65, it is determined whether or not i=0. When the result at step S65 is NO, steps S66 and S67 are executed in the same way as the aforementioned steps S27 and S28 shown in FIG. 7. On the other hand, when the result at step S65 is YES, a code Code($\omega$) is output at step S68. Then, a dictionary registration procedure 60c is carried out.

Steps S69 and S70 of the dictionary registration procedure 60c are carried out in the same way as the aforementioned steps S29 and S30 shown in FIG. 7. At step S71, the dictionary 110 is retrieved by the component First[Km][I] corresponding to the variable i. When it is determined, at step S70, that the value of the variable j is not "0", the dictionary 110 is retrieved by the component Next[ω] corresponding to the variable i. At step S73, the extension character K is set in the variable i.

The modifications of the dictionary shown in FIGS. 8A through 8D can be made at not only all the tree layer levels but also some tree layer levels. Normally, it will be effective at modifying the dictionary at layer levels close to the root of the tree structure. The aforementioned coding procedures according to the preferred embodiments can be implemented by a computer.

The present invention is not limited to the specifically disclosed embodiments, and variations and modifications may be made without departing from the scope of the present invention.

What is claimed is:

1. A data compression method comprising the steps of:
   (a) determining whether or not an input partial string which corresponds to a part of an input data string coincides with any of registered partial strings which have been registered in a dictionary in accordance with a retrieval order indicated by data stored in a list, said registered partial strings being arranged in a tree structure in an order in which said registered partial strings appear and being assigned reference numbers, said list being provided for each node of said tree structure;
   (b) coding said input partial string which makes a longest match with one of said registered partial strings by a reference number which has been registered in said dictionary and which has been assigned to said one of said registered partial strings;
   (c) assigning a reference number to a partial string obtained by adding extension data to said input partial string and registering said reference number in said dictionary; and
   (d) modifying said list so that a position of a first registered partial string among said registered partial strings in the tree structure is interchanged with a position of a second registered partial string among said registered partial strings, said first and second registered partial strings extending from an identical node of said tree structure.

2. A data compression method as claimed in claim 1, wherein said step (d) comprises the step of modifying said list so that the position of the first registered partial string is interchanged with the position of the second registered partial string which is at a tree layer level identical to that of said first registered partial string and is immediately prior to the first registered partial string in the tree structure.

3. A data compression method as claimed in claim 1, wherein said step (d) comprises the step of modifying said list so that the position of the first registered partial string is interchanged with the position of the second registered partial string positioned at a tree layer level identical to that of said first registered partial string and is first accessed in advance of accessing registered partial strings located at said tree layer level.

4. A data compression method as claimed in claim 1, wherein:
   said registered partial strings are accessed one by one in accordance with data placed at a beginning of said list; and
   said step (d) comprises the step of modifying said list so that data which indicates the said second registered partial string and which is located at a beginning of said list is replaced by data which shows said first registered partial string.

5. A data compression method as claimed in claim 1, wherein:
   said data compression method further comprises the step of detecting a frequency of accessing each of said registered partial strings; and
   said step (d) comprises the step of modifying said list on the basis of said frequency of accessing each of said registered partial strings.

6. A data compression method as claimed in claim 5, wherein:
   said data compression method further comprises the step of comparing the frequency with a predetermined threshold frequency; and
   said step (d) comprises the step of modifying said list when it is determined that the frequency is higher than said predetermined threshold frequency.

7. A data compression method as claimed in claim 6, wherein said step (d) comprises the step of modifying said list so that said registered partial strings extending from the identical node are rearranged in a decreasing order of frequency.

8. A data compression method as claimed in claim 1, wherein said step (d) comprises the step of modifying said list at predetermined layer levels of said tree structure.

9. A data compression method as claimed in claim 1, wherein said data compression method comprises the step of sequentially selecting one of lists respectively provided for the nodes in an order indicated by data stored in an index dictionary provided in said dictionary.

10. A data compression method as claimed in claim 1, wherein said input partial string is a partial string made up of one of the reference numbers and an extension symbol subsequent to a partial string specified by said one of the reference numbers.

11. A data compression method as claimed in claim 1, wherein coded data obtained at said step (b) comprises an LZW (Lempel-Ziv-Welch) code.

12. A data compression method comprising the steps of:
   (a) determining which one of a plurality of groups is related to an input partial string which corresponds to a part of an input data string on the basis of information about said input partial string, each of said groups storing at least one registered partial string registered in a dictionary;
   (b) determining whether or not said input partial string coincides with any of registered partial strings in accordance with a retrieval order indicated by data stored in a list, said registered partial strings being arranged in a tree structure in an order in which said registered partial strings appear and being assigned reference numbers, registered strings extending from an identical node of said tree structure being grouped into said plurality of groups, said list being provided for each of said groups;
   (c) coding said input partial string which makes a longest match with one of said registered partial strings by a reference number which has been registered in said dictionary and which has been assigned to said one of said registered partial strings;

(d) assigning a reference number to a partial string obtained by adding extension data to said input partial string and registering said reference number in said dictionary.

13. A data compression method as claimed in claim 12, wherein said step (a) comprises the step of determining which one of the plurality of groups is related to the input partial string on the basis of an extension symbol contained in said input data string, said input partial string being represented by a combination of one of the reference numbers and said extension symbol.

14. A data compression method as claimed in claim 13, wherein said step (a) comprises the step of determining which one of the plurality of groups is related to the input partial string on the basis of a most significant bit out of bits forming said extension symbol.

15. A data compression method as claimed in claim 13, wherein said step (a) comprises the step of determining which one of the plurality of groups is related to the input partial string on the basis of a plurality of bits out of bits forming said extension symbol.

16. A data compression method as claimed in claim 13, wherein said step (a) comprises the step of determining which one of the plurality of groups is related to the input partial string on the basis of a ratio of binary zeros contained in bits forming said extension symbol to binary ones contained therein.

17. A data compression method as claimed in claim 12, wherein said coded data comprises an LZW (Lempel-Ziv-Welch) code.

18. A data compression apparatus comprising:

first means for determining whether or not an input partial string which corresponds to a part of an input character string coincides with any of registered partial strings which have been registered in a dictionary in accordance with a retrieval order indicated by data stored in a list, said registered partial strings being arranged in a tree structure in an order in which said registered partial strings appear and being assigned reference numbers, said list being provided for each node of said tree structure;

second means, coupled to said first means, for coding said input partial string which makes a longest match with one of said registered partial strings by a reference number which has been registered in said dictionary and which has been assigned to said one of said registered partial strings;

third means, coupled to said first and second means, for assigning a reference number to a partial string obtained by adding extension data to said input partial string and registering said reference number in said dictionary; and fourth means, coupled to said first means, for modifying said list so that a position of a first registered partial string among said registered partial strings in the tree structure is interchanged with a position of a second registered partial string among said registered partial strings, said first and second registered partial strings extending from an identical node of said tree structure.

19. A data compression apparatus comprising:

first means for determining which one of a plurality of groups is related to an input partial string which corresponds to a part of an input data string on the basis of information about said input partial string, each of said groups storing at least one registered partial string registered in a dictionary;

second means, coupled to said first means, for determining whether or not said input partial string coincides with any of registered partial strings in accordance with a retrieval order indicated by data stored in a list, said registered partial strings being arranged in a tree structure in an order in which said registered partial strings appear and being assigned reference numbers, registered strings extending from an identical node of said tree structure being grouped into said plurality of groups, said list being provided for each of said groups;

third means, coupled to said first and second means, for coding said input partial string which makes a longest match with one of said registered partial strings by a reference number which has been registered in said dictionary and which has been assigned to said one of said registered partial strings;

fourth means, coupled to said second and third means, for assigning a reference number to a partial string obtained by adding extension data to said input partial string and registering said reference number in said dictionary.

* * * * *

UNITED STATES PATENT AND TRADEMARK OFFICE
CERTIFICATE OF CORRECTION

PATENT NO. : 5,150,119
DATED : September 22, 1992
INVENTOR(S) : Shigeru YOSHIDA et al.

It is certified that error appears in the above-indentified patent and that said Letters Patent is hereby corrected as shown below:

Col. 1,    line 7, before "present" insert --The--;
           line 39, change "High=Performance" to --High-Performance--.

Col. 3,    line 50, after "created" insert --.--;
           line 52, after "procedures" insert --.--.

Col. 4,    line 42, change "calculating" to --calculate--;
           line 61, change "an" to --a--.

Col. 5,    line 67, change "save" to --saved--.

Col. 7,    line 11, after "achieved" insert --by--.

Col. 9,    line 22, after "preferred" insert --embodiment--;
           line 47, change "th" to --the--.

Col. 10,   line 8, change "is" to --are--.

Col. 15,   line 26, delete "-";
           line 48, change "trees" to --tree--.

Col. 17,   line 4, change "until" to --unit--;
           line 56, change "based" to --basis--.

UNITED STATES PATENT AND TRADEMARK OFFICE
CERTIFICATE OF CORRECTION

PATENT NO. : 5,150,119
DATED : September 22, 1992
INVENTOR(S) : Shigeru YOSHIDA et al.

It is certified that error appears in the above-indentified patent and that said Letters Patent is hereby corrected as shown below:

* Col. 18, line 42, change "the" to --there exists a--;
  line 50, change "$\omega hd1$" to --$\omega_i$--.

* Col. 22, line 53, change "st" to --at--.

Signed and Sealed this

Seventh Day of June, 1994

Attest:

BRUCE LEHMAN

Attesting Officer

Commissioner of Patents and Trademarks